(12) United States Patent
Chevrier et al.

(10) Patent No.: US 11,280,840 B2
(45) Date of Patent: Mar. 22, 2022

(54) STATE OF HEALTH OF PARTIALLY DISCHARGED CELLS

(71) Applicant: 3M INNOVATIVE PROPERTIES COMPANY, St. Paul, MN (US)

(72) Inventors: Vincent J. L. Chevrier, St. Paul, MN (US); Brandon A. Bartling, Woodbury, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 280 days.

(21) Appl. No.: 16/629,062

(22) PCT Filed: Jun. 25, 2018

(86) PCT No.: PCT/IB2018/054671
§ 371 (c)(1),
(2) Date: Jan. 7, 2020

(87) PCT Pub. No.: WO2019/012357
PCT Pub. Date: Jan. 17, 2019

(65) Prior Publication Data
US 2020/0174079 A1    Jun. 4, 2020

Related U.S. Application Data

(60) Provisional application No. 62/530,700, filed on Jul. 10, 2017.

(51) Int. Cl.
*G01R 31/00* (2006.01)
*G01R 31/388* (2019.01)
(Continued)

(52) U.S. Cl.
CPC ......... *G01R 31/388* (2019.01); *G01R 31/374* (2019.01); *G01R 31/392* (2019.01); *H01M 10/0525* (2013.01); *H01M 10/486* (2013.01)

(58) Field of Classification Search
USPC ....................................................... 324/426
See application file for complete search history.

(56) References Cited

U.S. PATENT DOCUMENTS

| 2004/0220758 A1 | 11/2004 | Barsoukov |
| 2013/0138369 A1* | 5/2013 | Papana .................. B60L 58/12 |
| | | 702/63 |

(Continued)

FOREIGN PATENT DOCUMENTS

| WO | WO 2014-194019 | 12/2014 |
| WO | WO 2016-089811 | 6/2016 |

(Continued)

OTHER PUBLICATIONS

Blomgren, "Electrolytes for Advanced Batteries", Journal of Power Sources, Sep. 1999, vol. 81-82, pp. 112-118.

(Continued)

*Primary Examiner* — Vincent Q Nguyen
(74) *Attorney, Agent, or Firm* — Yufeng Dong

(57) ABSTRACT

A method may determine a remaining capacity of a cell that includes a lithium-alloying material in an electrode using a controller. The method includes receiving a temperature signal representing a temperature of a partially discharged cell and receiving a voltage signal representing a voltage of the partially discharged cell. The method further includes determining a time-dependent fade component and a cycle-dependent fade component of the cell. The time-dependent fade component of the cell is determined based on the temperature, the voltage, and an operating time of the cell. The cycle-dependent fade component of the cell is determined based on a depth of discharge of the partially discharged cell and cycle count data representing cycle-dependent fade from previous cycles of the cell. The method further includes determining a remaining capacity of the cell (Continued)

based on the time-dependent fade component, the cycle-dependent fade component, and a reference capacity of the cell.

20 Claims, 8 Drawing Sheets

(51) Int. Cl.
  *G01R 31/392* (2019.01)
  *G01R 31/374* (2019.01)
  *H01M 10/0525* (2010.01)
  *H01M 10/48* (2006.01)

(56) References Cited

U.S. PATENT DOCUMENTS

| | | |
|---|---|---|
| 2013/0181513 A1 | 7/2013 | Yano |
| 2016/0259013 A1 | 9/2016 | Basu |
| 2016/0313404 A1 | 10/2016 | Herscher |

FOREIGN PATENT DOCUMENTS

| | | |
|---|---|---|
| WO | WO 2016-126534 | 8/2016 |
| WO | WO 2016-166555 | 10/2016 |

OTHER PUBLICATIONS

Broussely, "Main Aging Mechanisms in Li Ion Batteries", Journal of Power Sources, Aug. 2005, vol. 146, No. 1-2, pp. 90-96.

Fathi, "Ultra High-Precision Studies of Degradation Mechanisms in Aged LiCoO2/Graphite Li-Ion Cells", Journal of The Electrochemical Society, 2014, vol. 161, No. 10, pp. A1572-A1579.

Petibon, "Study of Electrolyte Components in Li Ion Cells Using Liquid-Liquid Extraction and Gas Chromatography Coupled with Mass Spectrometry", Journal of The Electrochemical Society, 2014, vol. 161, No. 6, pp. A1167-A1172.

Pinson, "Theory of SEI Formation in Rechargeable Batteries: Capacity Fade, Accelerated Aging and Lifetime Prediction", Journal of The Electrochemical Society, 2013, vol. 160, No. 2, pp. A243-A250.

Smith, "A High Precision Coulometry Study of the SEI Growth in Li/Graphite Cells", Journal of The Electrochemical Society, 2011, vol. 158, No. 5, pp. A447-A452.

Yoshida, "Degradation Mechanism and Life Prediction of Lithium-Ion Batteries", Journal of The Electrochemical Society, 2006, vol. 153, No. 3, pp. A576-A582.

International Search Report for PCT International Application No. PCT/IB2018/054671, dated Oct. 1, 2018, 5 pages.

* cited by examiner

STATE OF HEALTH OF PARTIALLY DISCHARGED CELLS

CROSS REFERENCE TO RELATED APPLICATIONS

This application is a national stage filing under 35 U.S.C. 371 of PCT/IB2018/054671, filed Jun. 25, 2018, which claims the benefit of U.S. Application No. 62/530,700, filed Jul. 10, 2017, the disclosure of which is incorporated by reference in its/their entirety herein.

BACKGROUND

Over 80% of the US population drives less than 100 miles every day. Typically, lithium ion (Li-ion) batteries in battery electric vehicle (BEV) applications are not fully discharged after operation. For a BEV with a nominal 200-mile range, driving a distance of 100 miles may correspond to a depth of discharge of approximately 50%. Li-ion batteries are one of the most expensive components of a BEV and each recharge cycle may reduce the life of the Li-ion battery.

SUMMARY

According to embodiments of the disclosure, a controller may determine a remaining capacity of a cell that includes a lithium-alloying material in an electrode using a method discussed herein. The method includes receiving a temperature signal representing a temperature of a partially discharged cell and receiving a voltage signal representing a voltage of the partially discharged cell. The method further includes determining a time-dependent fade component and a cycle-dependent fade component of the cell. The time-dependent fade component of the cell is determined based on the temperature, the voltage, and an operating time of the cell. The cycle-dependent fade component of the cell is determined based on a depth of discharge of the partially discharged cell and cycle count data representing cycle-dependent fade from previous cycles of the cell. The method further includes determining a remaining capacity of the cell based on the time-dependent fade component, the cycle-dependent fade component, and a reference capacity of the cell.

In other embodiments, a system may include a controller configured to determine a remaining capacity of a cell that includes a lithium-alloying material in an electrode. The controller may be configured to receive a temperature signal representing a temperature of a partially discharged cell and receive a voltage signal representing a voltage of the partially discharged cell. The controller may be further configured to determine a time-dependent fade component and a cycle-dependent fade component of the cell. The time-dependent fade component of the cell is determined based on the temperature, the voltage, and an operating time of the cell, while the cycle-dependent fade component of the cell is determined based on a depth of discharge of the partially discharged cell and cycle count data representing cycle-dependent fade from previous cycles of the cell. The controller is further configured to determine a remaining capacity of the cell based on the time-dependent fade component, the cycle-dependent fade component, and a reference capacity of the cell.

In other embodiments, a computer-readable storage medium includes storing instructions that, when executed, cause a controller to determine a remaining capacity of a cell that includes a lithium-alloying material in an electrode. The instructions may further cause a controller to receive a temperature signal representing a temperature of a partially discharged cell and receive a voltage signal representing a voltage of the partially discharged cell. The instructions may further cause a controller to determine a time-dependent fade component and a cycle-dependent fade component of the cell. The time-dependent fade component of the cell based on the temperature, the voltage, and an operating time of the cell, while the cycle-dependent fade component of the cell based on a depth of discharge of the partially discharged cell and cycle count data representing cycle-dependent fade from previous cycles of the cell. The instructions may further cause a controller to determine a remaining capacity of the cell based on the time-dependent fade component, the cycle-dependent fade component, and a reference capacity of the cell.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

Like symbols in the drawings indicate like elements. Dotted lines indicate optional or functional components, while dashed lines indicate components out of view.

DETAILED DESCRIPTION

Cells that use silicon-based electrodes may consume electrolyte during cycling and over a period of time. As electrolyte is consumed, the cell may gradually lose capacity until electrolyte is fully consumed, resulting in a sudden capacity drop and subsequent cell failure. It is desirable to be able to track the state of health of the cell in BEV and grid applications for reasons including, but not limited to: alerting the user/manufacturer that the battery is near end of life, determining a need for maintenance, and assessing potential remaining cell life for secondary applications such as grid applications, and the like.

According to principles of the disclosure, a system may determine a state of health of partially discharged cells. A particular cell may have associated cell reference data obtained from reference cells. This cell reference data may represent capacity relationships of the cell for operating characteristics or parameters of the cell such as current, temperature, voltage, cycle number, and time. After a partial discharge of the cell, the system may measure the operating characteristics of the cell and determine remaining charge capacity from the operating characteristics using the cell reference data. The remaining charge capacity may be a function of a time-dependent fade component and a cycle-dependent fade component, each of which may be determined by one or more operating characteristics. By using cell reference data for the capacity relationships of a cell, the state of health of the cell may be determined quickly using a limited number of operating characteristics and without requiring a full discharge of the cell.

Without limiting the present disclosure to any particular theory, consumption of electrolyte in lithium alloying (Li-alloying) electrode materials, such as silicon-based (Si-based) electrode materials, may be due to volume changes of Li-alloying electrodes during lithiation and delithiation. These volume changes may cause fractures in the solid-electrolyte interphase (SEI) layer that exposes fresh silicon alloy. The electrolyte reacts with the exposed silicon alloy to create a passivating layer. This reaction consumes electrolyte and, correspondingly, decreases the capacity of the cell. In addition to fracture-induced electrolyte consumption, the SEI layer may thicken over time, leading to further consumption of electrolyte.

Figure 6A:
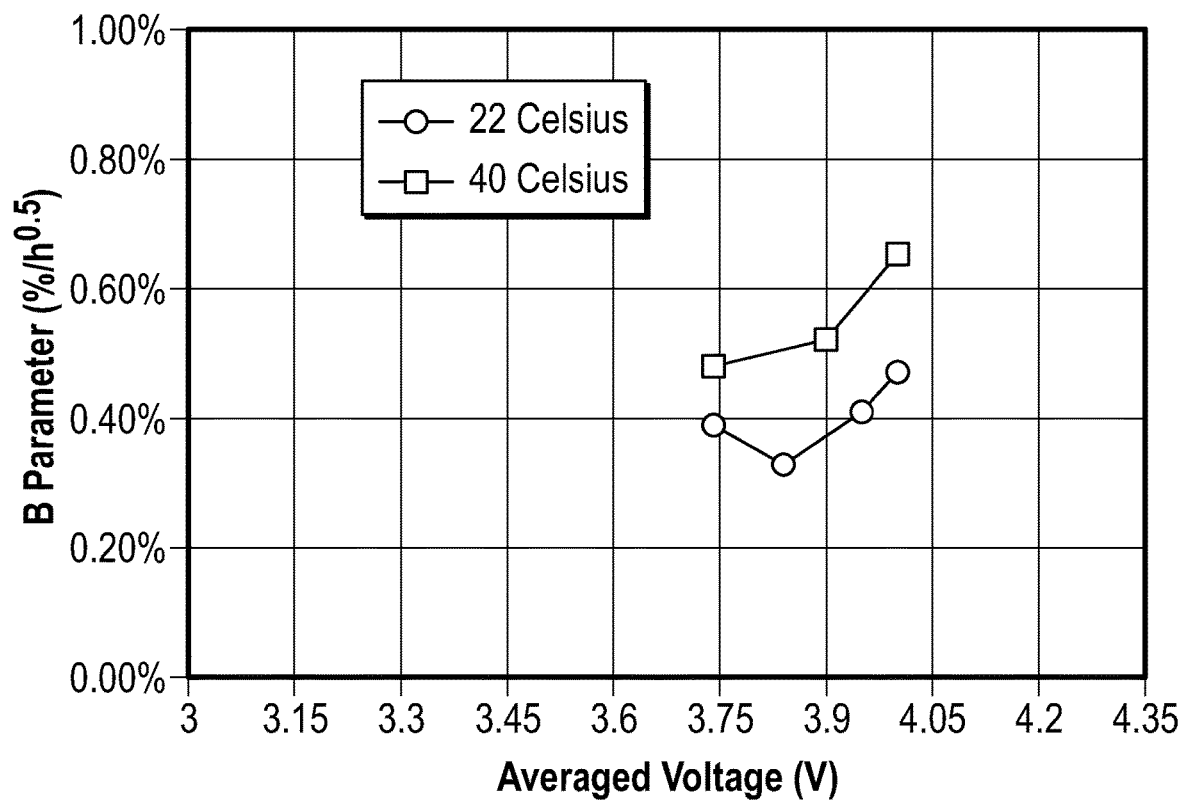
FIG. 6A is a graph of the time-dependent fade parameters, B, for averaged voltage for Examples 1 and 5-10.

The electrolyte consumption of Li-alloying electrode cells, and their corresponding fade in charge capacity, may be characterized by a cycle-dependent fade component and a time-dependent fade component. The cycle-dependent fade component may roughly correspond to fracture-related SEI growth. This cycle-dependent fade component may be dependent on cycle number, depth of discharge, and temperature. For example, a cycle-dependent fade parameter, C, corresponding to the cycle-dependent fade component, may be high when cycling a cell with full depth of discharge and may decrease, linear or otherwise, with decreasing depth of discharge until a particular threshold, such as approximately 60%, where the cycle-dependent fade parameter becomes zero. It is theorized that the dependence of the cycle-dependent fade component on depth of discharge may be due to the contribution of graphite and silicon material to the capacity as a function of depth of discharge. The time-dependent fade component may roughly correspond to thickening-related SEI growth. The time-dependent fade component may be dependent on time, voltage, and temperature. For example, a time-dependent fade parameter, B, corresponding to the time-dependent fade component, may increase with increasing average voltage and increasing temperature, as seen in FIG. 6A. It is theorized that the time-dependent fade component captures the capacity fade caused by parasitic reactions, as parasitic reactions are expected to increase with temperature and average voltage.

The remaining capacity of a cell may be represented by an initial charge capacity of a reference cycle reduced by the cycle-dependent fade component and time-dependent fade component, as seen in Equation 1 below:

$$Q(i, t, V, T) = Q_0 - \int \frac{B(V, T)}{2(t + t_0)^{\frac{1}{2}}} dt - \sum_i C(D_i^{max}, T) \quad \text{[Equation 1]}$$

Figure 6B:
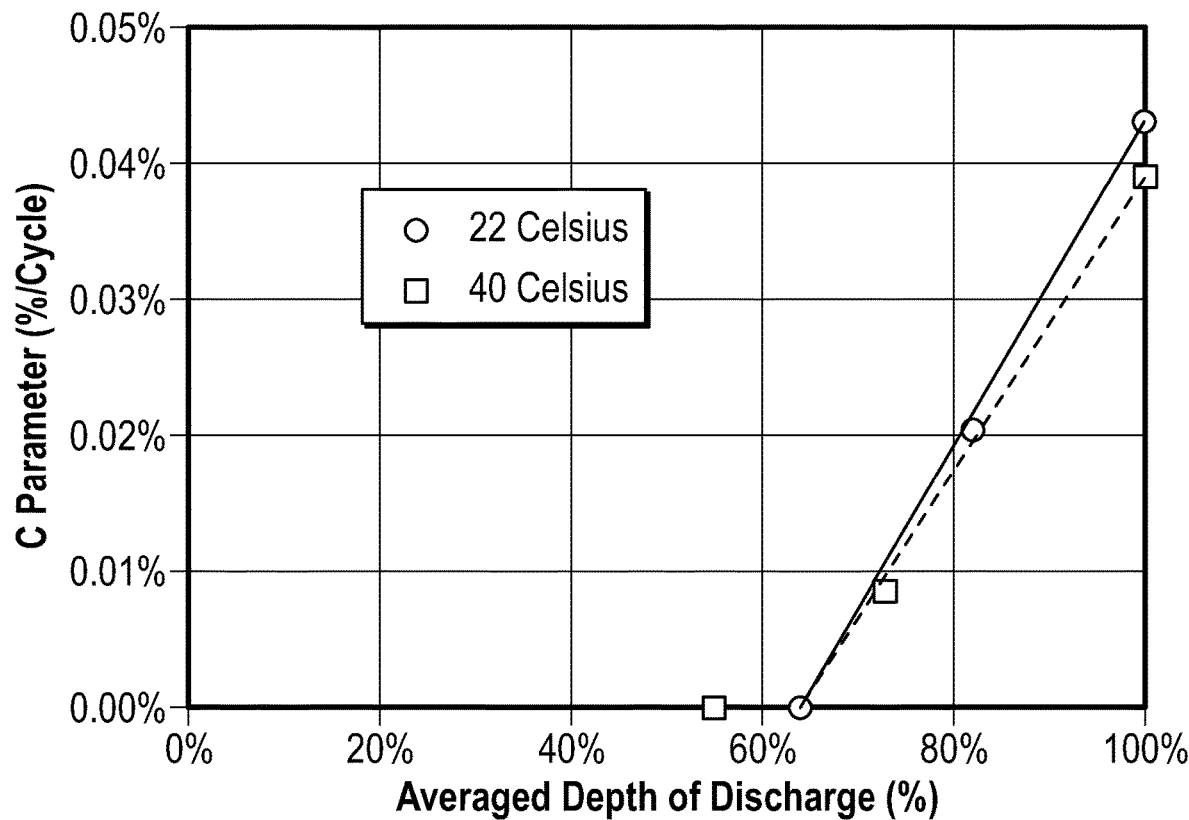
FIG. 6B is a graph of cycle-dependent fade parameters, C, for averaged depth of discharge for Examples 1 and 5-10.

In Equation 1 above, Q is a normalized remaining available charge capacity of the cell, i is a cycle count of the cell, t is a time of operation of the cell, V is a voltage of the cell, T is a temperature of the cell, $Q_0$ is a charge capacity of a reference cycle of the cell (nominally 1; it may be reduced or reset based on full discharge of the cell as a reference charge capacity). B is the time-dependent fade parameter controlling the time-dependent component of the cell, $t_0$ is a degassing time constant, and C is the cycle-dependent fade parameter controlling the cycle-dependent component of the cell, and $D_i^{max}$ is a maximal depth of discharge of cycle i of the cell. The maximal depth of discharge, $D_i^{max}$, may represent a depth of discharge of the partially discharged cell in the current cycle, i. The time-dependent fade parameter, B, may be dependent on voltage, V, and temperature, T, as seen in the example of FIG. 6A. The cycle-dependent fade parameter, C, may be dependent on the maximal depth of discharge reached in cycle i, $D_i^{max}$, and temperature, T, as seen in the example of FIG. 6B. As noted above, the charge capacity of the reference cycle, $Q_0$, may be determined from a full discharge of the cell, which may correspondingly reset a cycle count, i, of the cell.

In some examples, the cycle-dependent fade parameter, C, for a cycle, i, may be determined using the maximal depth of discharge of the cycle i, $D_i^{max}$. In some examples, the temperature dependence of the cycle-dependent fade parameter, C, may be weak. Two references may be used to define the dependence of the depth of discharge on the C parameter: a cycle-dependent fade parameter, C, at full depth of discharge, $C^{full}$, and a charge capacity contribution of the Si-based material, to the cell, $D^{Si}$. The charge capacity contribution of the Si-based material, $D^{Si}$, to the cell may be determined from, for example, an individual gravimetric capacity and weight percent of the active materials in the anode. For example, an anode may include multiple components that contribute to charge capacity, such as a silicon-based material and a graphite-based material. The graphite-based material may primarily contribute to charge at higher charge capacities until charge from the graphite-based material is reduced, after which the silicon-based material may primarily or wholly contribute to charge at lower charge capacities. In these examples, the cycle dependent fade parameter, C, may be determined by the following equation:

$$C(D_i^{max}) = \begin{cases} 0 & D_i^{max} \leq D^{Si} \\ \frac{C^{full}}{1 - D^{Si}}(D_i^{max} - D^{Si}) & D_i^{max} \geq D^{Si} \end{cases} \quad \text{[Equation 2]}$$

In Equation 2 above, when a maximal depth of discharge, $D_i^{max}$, is below a charge capacity contribution of the Si-based material, $D^{Si}$, cycle-dependent fade does not contribute to fade of the cell. The maximal depth of discharge, $D_i^{max}$, may be determined from a voltage. V, using a reference capacity-voltage curve, or from a current, I, by determining capacity based on integrating current with respect to discharge time. For determination of the depth of discharge by voltage, the reference capacity-voltage curve may correlate a capacity of the cell with a voltage. The cycle-based fade parameter, C, may be made a function of voltage, V, via the reference capacity-voltage curve. For determination of the depth of discharge by current, the current, I, may be integrated over time of discharge, $t_d$, to determine depth of discharge. The fraction of the capacity with respect to the estimated cell full capacity, $Q^{full}$, may represent the depth of discharge, such as in the equation $$D = \frac{1}{Q^{full}} \int_0^{t_d} I dt_d.$$

The cycle-based fade parameter, C, may be made to be a function of current, I, via the integration of current, I, over discharge time, $t_d$. The voltage, V, and time, t, dependence of the time-dependent fade parameter, B, and the maximal depth of discharge of the cycle i, $D_i^{max}$, and temperature, T, dependence of the cycle-dependent parameter, C, may be established using reference cells as shown in FIGS. 6A and 6B. The cycle-dependent fade parameter may be zero below a given depth of discharge and non-zero above a given depth of discharge. The cycle-dependent fade parameter may be zero below a given depth of discharge and non-zero with a dependence on depth of discharge above a given depth of discharge. The dependence on depth of discharge may be monotonically increasing with depth of discharge, may be linear as in Equation 2, may be quadratic, may be exponential, or may be determined experimentally using reference cells.

The above concepts may be used to track and determine the available charge capacity of a cell as a function of some or all of measured current, cycle, time, voltage, and temperature without requiring a full discharge of the cell. For example, a cell may not be operated in the same manner as its corresponding reference cell, leading to different combinations of time of operation and number of cycles that produce differing remaining capacities. A system using the above concepts may predict the remaining capacity of a cell based on time-dependent and cycle-dependent fade using additional measurable cell parameters, such as voltage and temperature.

In addition to available charge capacity of a cell, the above concepts may also be used to track the remaining electrolyte of a cell or electrolyte component (e.g. one of the solvents) of an electrolyte. As discussed above, charge capacity of a cell may be correlated with the remaining electrolyte or electrolyte component, such that once the remaining electrolyte or electrolyte component is consumed, the cell may not have any remaining capacity. The remaining electrolyte component of a cell may be represented by the initial amount of electrolyte component of a reference cycle reduced by the cycle-dependent electrolyte component consumption and time-dependent electrolyte component consumption, as seen in Equation 3 below:

$$m(i, t, V, T) = m_0 - \int \frac{Z(V, T)}{2(t+t_0)^{\frac{1}{2}}} dt - \sum_i X(D_i^{max}, T) \quad \text{[Equation 3]}$$

In Equation 3 above, m is the amount of electrolyte component remaining, $m_0$ is the starting amount of electrolyte component, Z is a time-dependent consumption parameter, and X a cycle-dependent consumption parameter. A substantial failure of the cell may be predicted to occur when amount of electrolyte component remaining, m, reaches approximately zero. The cycle-dependent consumption parameter may be zero below a given depth of discharge and non-zero above a given depth of discharge. The cycle-dependent consumption parameter may be zero below a given depth of discharge and non-zero with a dependence on depth of discharge above a given depth of discharge. The dependence on depth of discharge may be monotonically increasing with depth of discharge, may be linear, may be quadratic, may be exponential, or may be determined experimentally using reference cells.

Equation 1 may be simplified to represent the time-dependent fade component and cycle-dependent fade component of a cell as in Equation 4 below:

$$Q(i,t,V,I,T) = Q_0 - Q_B(V,T,t) - Q_C(V,T,i) \quad \text{[Equation 4]}$$

In Equation 4 above, $Q_B$ represents a time-dependent fade component of a cell and $Q_C$ represents a cycle-dependent fade component of a cell. Similarly, Equation 3 may be simplified to represent the time-dependent fade component and cycle-dependent fade component of a cell with respect to electrolyte component of the cell, as in Equation 5 below:

$$m(i,t,V,I,T) = m_0 - m_Z(V,T,t) - m_X(V,I,T,i) \quad \text{[Equation 5]}$$

In Equation 5 above, $m_Z$ represents a time-dependent electrolyte consumption component of a cell and $m_X$ represents a cycle-dependent electrolyte consumption component.

The techniques described above allow the determination of remaining total capacity of a cell and/or the determination of remaining electrolyte components in a cell for a full or partial discharge. Such techniques may be implemented in a variety of systems, such as an integrated circuit on a printed circuit board or in a standalone device which can be connected to an electrochemical cell or a battery pack, or which receives measurements made on an electrochemical cell or battery pack. In some examples, the chip or device may be integrated into the battery pack, integrated in a control system, or exist separately from the cell or battery pack.

In some examples, the techniques described above may be useful in applications where the cells are infrequently fully discharged such as automotive applications and grid storage applications where constant access to storage capacity is required. In the event a complete discharge does occur for the cell, the actual measured capacity can be used to reset the technique. Since the technique predicts fade contributions, resetting the technique may include replacing the predicted fade with the actual measured fade.

Figure 1:
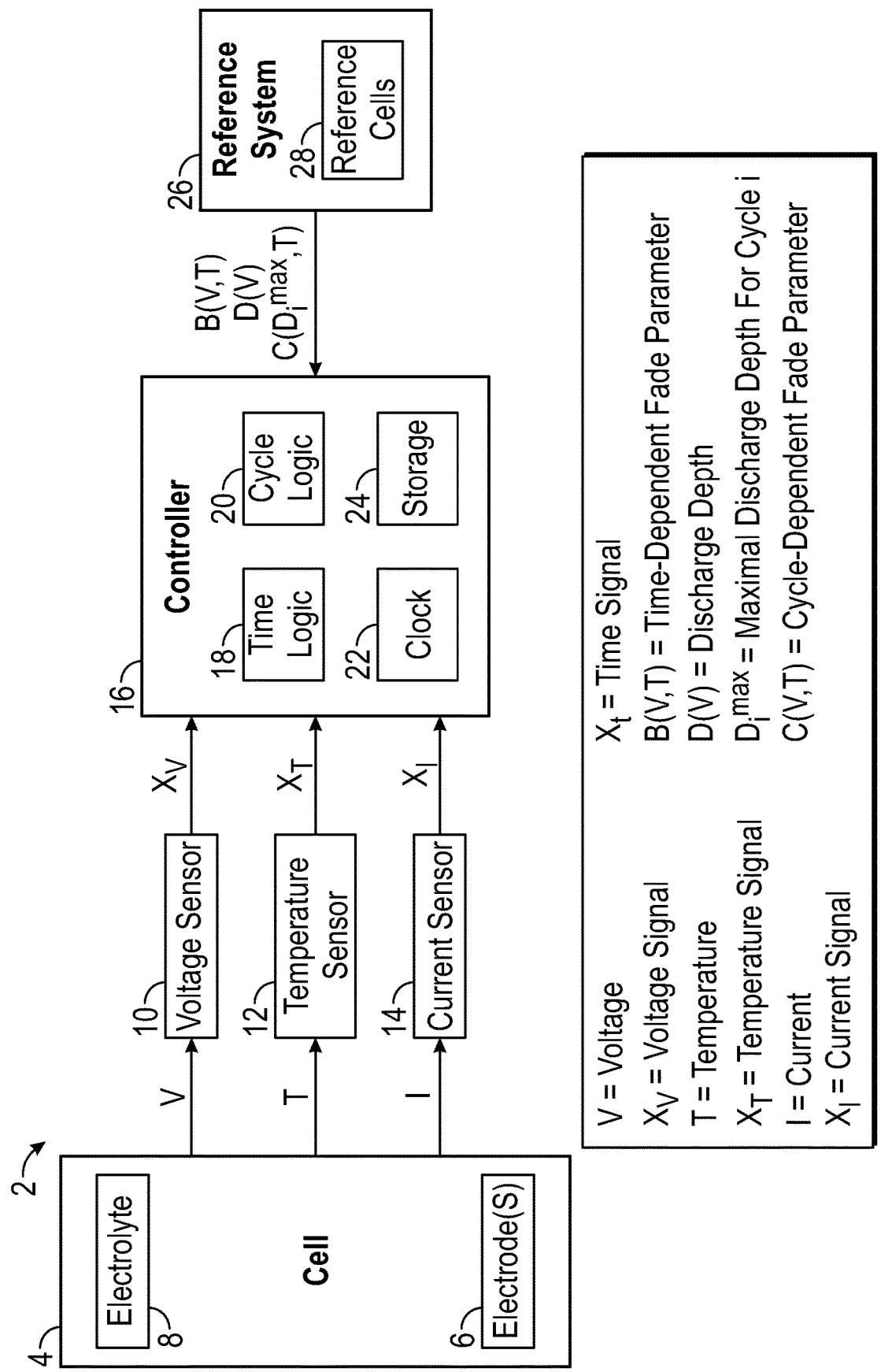
FIG. 1 is an example block diagram illustrating a system for determining a state of health of a cell in accordance with some embodiments discussed herein.

FIG. 1 is an example block diagram illustrating a system 2 for determining a state of health of a cell 4. System 2 may include cell 4, a voltage sensor 10, a temperature sensor 12, a current sensor 14, a controller 16, storage 24, and a reference system 26. In addition to the example configuration of FIG. 1, components of FIG. 1 may be present in a variety of configurations. For example, storage 24 may be part of controller 16.

Cell 4 may include electrodes 6 and an electrolyte component 8. Electrodes 6 may include an anode and a cathode. Electrodes 6 may include a material capable of alloying with lithium (Li-alloying material, e.g., Mg, Ca, Sr, Ag, Zn, B, Al, C (amorphous), Si, Sn, Pb. Sb, and Bi) for lithiation and delithiation of the electrode 6. In some examples, at least one of electrodes 6, such as an anode, includes a Si-based material. Si-based materials that may be used include, but are not limited to: discrete silicon particles, such as nanostructured silicon particles; silicon composites, such as silicon nanocomposites and silicon buffer phases, such as $SiO_x$; silicon/carbon composites, silicon alloys, such as a silicon alloy that includes elements such as iron, silver, lithium, tin, bismuth, lead, antimony, germanium, zinc, gold, platinum, palladium, arsenic, aluminum, gallium, indium, thallium, molybdenum, niobium, tungsten, tantalum, copper, titanium, vanadium, chromium, nickel, cobalt, zirconium, yttrium, carbon, oxygen, a lanthanide, or an actinide; and the like. Silicon alloys comprising Si and one or more transition metals and optionally carbon, silicon alloys comprising Si, Sn. and one or more transition metals, and optionally carbon silicon alloys having the formula $Si_xM_yC_z$ where x, y, and z represent atomic percent values and (a) x>2y+z; (b) x, y and z are greater than 0; and (c) M is Fe and/or Ti or one or more transition metals. In some embodiments, $65\% \leq x \leq 85\%$, $70\% \leq x \leq 80\%$, $72\% \leq x \leq 74\%$, or $75\% \leq x \leq 77\%$; $5\% \leq y \leq 20\%$, $14\% \leq y \leq 17\%$, or $13\% \leq y \leq 14\%$; and $5\% \leq z \leq 15\%$, $5\% \leq z \leq 8\%$, or $9\% \leq z \leq 12\%$. Silicon alloys comprising Si, a transition metal and N. Silicon alloys with a first cycle irreversible capacity of less than 30%, less than 20%, less than 10% or even less than 5%. Nanostructured or amorphous silicon alloys with a maximum Scherrer grain size of less than 50 nm, less than 40 nm, less than 30 nm, less than 20 nm, less than 15 nm, less than 10 nm, or even less than 5 nm. Any of the above embodiments comprising a surface coating. Examples of surface coatings include but are not limited to carbon coating, a graphitic coating, polymer coating, lithium carbonate coating, an organic coating, an inorganic coating, a nanoparticle coating, a polyimide coating, a lithium polyacrylate coating, a thermoset resin coating. Any of the above embodiments may take the form of particles. The particles may have a diameter (or length of longest dimension) that is no greater than 60 µm, no greater than 40 µm, no greater than 20 µm, or no greater than 10 µm, no greater than 5 µm, no greater than 1 µm, no greater than 500 nm, no greater than 100 nm or even smaller, at least 0.5 µm, at least 1 µm, at least 2 µm, at least 5 µm, or at least 10 µm or even larger, or 0.5 to 10 µm, 1 to 10 µm, 2 to 10 nm, 40 to 60 µm, 1 to 40 µm, 2 to 40 µm, 10 to 40 µm, 5 to 20 µm, 10 to 20 µm, 1 to 30 µm, 1 to 20 µm, 1 to 10 µm, 0.5 to 30 µm, 0.5 to 20 µm, or 0.5 to 10 µm.

In some examples, electrodes 6 may include other active materials involved in lithiation and delithiation of cell 4. Other active materials, such as graphite, may act as a lithium intercalation material, conductive network, electrode calendaring lubricant, and diluting material for total volume expansion of the electrode 6, among other actions. Other active materials may include carbon, such as graphite; and the like. In some examples, the anode may contain passive materials that are not involved in lithiation and delithiation of cell 4. Passive materials may include binders; adhesion promoters; additives, such as conductive additives; and the like. Further examples of anodes that contain an Si-based material may be found in WO Patent Application Publication No. 2014/194019 entitled "ELECTRODE COMPOSITION, ELECTROCHEMICAL CELL AND METHOD OF MAKING ELECTROCHEMICAL CELL", WO Patent Application Publication No. 2016/089811 entitled "ANODE MATERIALS FOR LITHIUM ION BATTERIES AND METHODS OF MAKING AND USING SAME", and WO Patent Application Publication No. 2016/149442 entitled "ANODE MATERIALS FOR LITHIUM ION BATTERIES AND METHODS OF MAKING AND USING SAME", incorporated by reference herein.

Figure 6C:
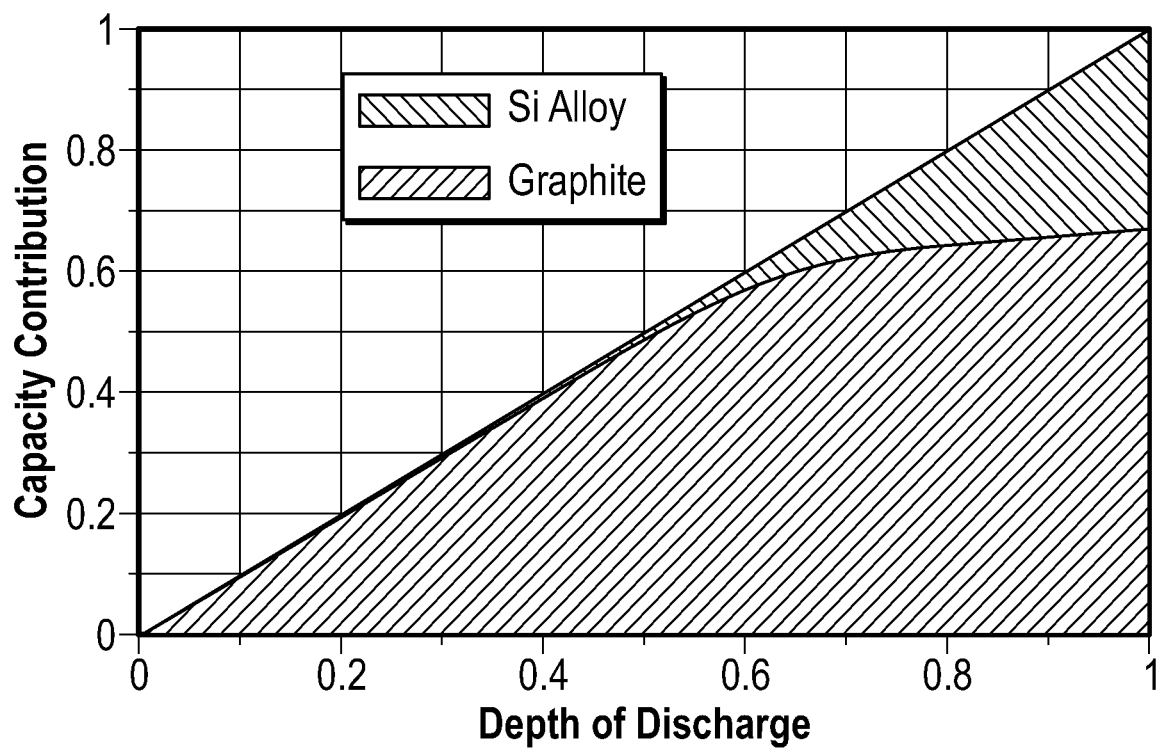
FIG. 6C is a graph of the capacity contribution of Si alloy and graphite as a function of depth of discharge at a C/2 rate for Examples 1-10.

In some examples, electrodes 6 include a Si-based material and a graphite-based material. A Si-based material may have a greater charge density than the graphite-based material, but may be subject to greater expansion than the graphite-based material and thus higher rates of electrolyte component consumption. Due to a lower average delithiation potential for graphite than silicon, the graphite-based material may delithiate before the Si-based material, as seen in FIG. 6C. Electrodes 6 having both a Si-based material and a graphite-based material may have a charge contribution of Si-based material and a charge contribution of graphite-based material. The composition of electrodes 6 may be selected for a ratio of Si-based material and graphite-based material so that the graphite-based material may primarily contribute for shallow cycles, consuming less electrolyte, while the silicon-based material may contribute for deeper cycles, giving the cell greater capacity for a given volume. The composition of electrodes 6 can be adjusted based on the average, typical, or extreme use cases. A system may both maximize the life and energy density of a cell for a given application by selecting the capacity contribution of the graphite to correspond to the usual shallow cycling and the Si-based capacity contribution to satisfy the infrequent deep or full range cycling.

In other examples, electrodes may include additional active materials beyond Si-based and graphite-based materials. In addition to charge capacity, materials included in electrodes may have properties that affect rates of charge and discharge. For example, a material may be incorporated into the electrode that allows for non-Faradaic charge storage that can respond to very fast charge and discharges. For example, high surface area ceramic particles may be incorporated into electrodes, such as through atomic layer deposition. These particles allow for storage of charge at the electrical double layer that can be quickly depleted to meet fast discharges.

Cell 4 may include electrolyte 8. Electrolyte 8 may contain lithium salts for use in lithiation and delithiation of one or more electrodes 6. In some examples, electrolyte 8 may include lithium salts, such as $LiPF_6$, $LiBF_4$, and $LiClO_4$, in an organic solvent, such as ethylene carbonate (EC), propylene carbonate (PC), ethylmethyl carbonate (EMC), vinylene carbonate (VC), and dimethyl carbonate (DMC), or a fluorinated organic solvent, such as fluoroethylene carbonate (FEC), and the like, including combinations of any of the above. Further examples of electrolytes may be found in WO Patent Application Publication No. 2016/126534 entitled "ELECTROCHEMICAL CELLS THAT INCLUDE LEWIS ACID:LEWIS BASE COMPLEX ELECTROLYTE ADDITIVES", incorporated by reference herein.

System 2 may include sensors configured to measure voltage, temperature, and current from cell 4. As discussed above, these operating characteristics may be correlated with time- and cycle-dependent fade. Voltage sensor 10 may be configured to measure a voltage, V, of cell 4. Voltage sensor 10 may be physically coupled to at least an anode and a cathode of electrodes 6 of cell 4 and to controller 16. Voltage sensor 10 may sense a potential difference, V, between a voltage from each of the anode and cathode of cell 4 and send a voltage signal, $X_V$, to controller 16 that represents the potential difference. V, of the cell 4. Voltage sensors 10 that may be used include, but are not limited to, voltage sensors with an accuracy of better than 1 mV. Temperature sensor 12 may be configured to measure a temperature of cell 4. Temperature sensor 12 may be coupled to at least one point of cell 4 and to controller 16. Temperature sensor 12 may sense a temperature, T, from cell 4 and send a temperature signal, $X_T$, to controller 16 that represents the temperature, T. In some examples, the temperature, T, is an average temperature of cell 4. Temperature sensors that may be used include, but are not limited to, thermocouples, thermistors, and the like. Current sensor 14 may be configured to measure a current of cell 4. Current sensor 14 may be coupled to at least an anode and a cathode of electrodes 6 of cell 4 and to controller 16. Current sensor 14 may sense a current, I, between the anode and the cathode of cell 4 and send a current signal, $X_I$, to controller 16 that represents the current, I, of the cell. Current sensors that may be used include, but are not limited to, current sensors with an accuracy of better than 1 A, better than 1 mA, better than 1 uA, or even better than 1 nA.

Reference system 26 may be configured to generate cell reference data corresponding to cell 4 for use by controller 16. Reference system 26 may include reference cells 28 that correspond in operating behavior to cell 4, such as by exhibiting similar performance and fade characteristics as cell 4. Reference system 26 may be configured to test reference cells 28 and determine cell reference data from reference cells 28. For example, reference system 26 may determine cell reference data using techniques such as those described in the EXAMPLES section below. The cell reference data may include any data that relates operating conditions of reference cells 28, such as voltage, temperature, and depth of discharge, to the time-dependent fade component, $Q_B$, and cycle-dependent fade component, $Q_C$, of reference cells 28, such as time-dependent fade parameters, B, depth of discharge, D, and cycle-dependent fade parameters, C, as illustrated in Equations 1-4 above. For example, reference system 26 may generate cell reference data for relationships between the time-dependent fade parameter, B(V,T), with voltage and temperature, the cycle-dependent fade parameter, C ($D_i^{max}$,T), with maximal depth of discharge and temperature, and depth of discharge, D(V), with voltage, V.

Controller 16 may be configured to determine a state of health of cell 4 from measured operating characteristics of cell 4. The state of health of cell 4 may be a representation of the remaining charge capacity or remaining electrolyte mass of cell 4. For example, the state of health may include a remaining charge for a particular cycle, an estimated remaining life of cell 4 based on current and previous cycles, an estimated time of failure of cell 4, and the like.

Controller 16 may be configured to receive cell reference data from reference system 26 and operating characteristics from sensors coupled to cell 4. Controller 16 may be coupled to voltage sensor 10, temperature sensor 12, and current sensor 14. Controller 16 may be configured to receive a voltage signal, $X_V$, representing the voltage, V, from voltage sensor 10, a temperature signal, $X_T$, representing the temperature, T, from temperature sensor 12, and a current signal, $X_I$, representing the current, I, from current sensor 14. Controller 16 may also be configured to receive cell reference data, including time-dependent fade parameter information, B(V,T), depth of discharge information, D(V), and cycle-dependent fade parameter information, C($D_i^{max}$, T) and/or C(V,T), from reference system 26. In some examples, controller 16 may be a probe configured to couple voltage sensor 10, temperature sensor 12, and current sensor 14, while in other examples, controller 16 may be a sensor device that includes voltage sensor 10, temperature sensor 12, and current sensor 14. Controller 16 may include any of a wide range of devices, including processors (e.g., one or more microprocessors, one or more application specific integrated circuits (ASICs), one or more field programmable gate arrays (FPGAs), or the like), one or more servers, one or more desktop computers, one or more notebook (i.e., laptop) computers, one or more cloud computing clusters, or the like.

Controller 16 may be configured to receive the cell reference data and operating characteristics, and to determine a state of health of cell 4 based on the cell reference data and operating characteristics through implementation of the principles of Equations 1-4 discussed above. While these principles will be discussed with reference to time logic 18 and cycle logic 20, steps performed by these logic circuits may be performed by other circuits. Controller 16 may include time logic 18, cycle logic 20, clock 22, and storage 24. Storage 24 may be configured to store cell data related to relationships between capacity behavior of cell 4 and cell operating characteristics of cell 4 and/or reference system 26. Cell data may include cell reference data discussed above, as well as data relating to previously measured or determined operating characteristics, such as voltage, V, temperature, T, current, I, operating time, t, and cycle count, i, charge capacity of a reference cycle, $Q_0$, charge contribution of Si-based material, $D^{Si}$, cycle-dependent fade parameters for previous cycles, $C_{i-1}$, and full discharges, $C^{full}$, and other cell parameters included in Equations 1-4 above. Storage 24 may include any type of non-volatile memory device. Some examples of memory devices include, but are not limited to, flash memory devices (e.g., NAND or NOR), phase-change memory (PCM), devices, resistive random-access memory (ReRAM) devices, magnetoresistive random-access memory (MRAM) devices, ferroelectric random-access memory (F-RAM), and any other type of non-volatile memory device. Clock 22 may be configured to track a time. Clock 22 may be coupled to controller 16 and configured to send a time signal, $X_t$, to controller 16 that represents an operating time, t, and a degas constant, $t_0$. In some examples, clock 22 may be a clock of controller 16, while in other examples, clock 22 may be a system clock of a battery electric vehicle.

Time logic 18 may be configured to determine the time-dependent fade component, $Q_B$, of cell 4 based on the measured voltage, V, temperature, T, and operating time, t, as illustrated in Equation 1. Time logic 18 may determine a time-dependent fade parameter, B, from the measured voltage, V, and temperature, T. For example, time logic 18 may look up cell reference data in storage 24 for a time-dependent fade parameter, B(V,T), based on the measured voltage, V, and temperature, T. Time logic 18 may determine the time-dependent fade component, $Q_B$, of cell 4 from the time-dependent fade parameter, B, and the operating time, t, according to Equation 1 above. For example, time logic 18 may use numerical methods to determine the time-dependent fade component, $Q_B$.

Cycle logic 20 may be configured to determine the cycle-dependent fade component, $Q_C$, of cell 4 based on depth of discharge—such as through the measured voltage, V, or the measured current, I—and cycle count data, and/or optionally, the temperature, T, as illustrated in Equations 1 and 2. For example, in cell 4, temperature may not significantly affect cycle-dependent fade, such that temperature may not be used to determine a cycle-dependent fade parameter, C. Cycle count data may represent cycle-dependent fade from previous cycles of cell 4, such as cycle-dependent fade parameters, $C_{i-1}$, for previous cycles. Cycle logic 20 may determine a maximal depth of discharge, $D_i^{max}$ from the voltage, V. and/or the current, I. In some examples, the depth of discharge, D(V), may depend on or be correlated to voltage, V, as described above, and may be expressed as a voltage-discharge curve. For example, cycle logic 20 may look up cell reference data in storage 24 for a depth of discharge, D(V), for the measured voltage, V. In some examples, the depth of discharge, $D(I,t_d)$, may depend on or be correlated to current, I, and time of discharge, $t_d$, as described above, and may be expressed according to an integral of current with respect to discharge time. In some examples, depth of discharge may depend on both voltage, V, and current, I, such as by an average of depth of discharge determined by each of the voltage, V, and the current, I. Cycle logic 20 may determine a cycle-dependent fade parameter, $C(D_i^{max},T)$, based on the determined maximal depth of discharge, $D_i^{max}$, and the temperature, T. The cycle-dependent fade parameter, $C(D_i^{max},T)$, may depend on or be correlated to maximal depth of discharge, $D_i^{max}$, and temperature, T, as described in Equations 1 and 2 above. For example, cycle logic 20 may look up cell reference data in storage 24 for a cycle-dependent fade parameter, $C(D_i^{max}, T)$, for the determined maximal depth of discharge, $D_i^{max}$, and the temperature, T. Cycle logic 20 may determine the cycle-dependent fade component, $Q_C$, of cell 4 from the cycle-dependent fade parameter, C, and the cycle count data. For example, cycle logic 20 may sum the cycle-dependent fade parameter for the current cycle, $C_i$, with the cycle-dependent fade parameters from previous cycles, $C_{i-1}$.

In some examples, cycle logic 20 may be configured to determine the cycle-dependent fade parameter, $C(D_i^{max})$, based on the cycle-dependent fade parameter at a full depth of discharge, $C^{full}$, the determined maximal depth of discharge, $D_i^{max}$, and the capacity contribution of the Si-based material, $D^{Si}$, as described in Equation 2 above. The cycle-dependent fade parameter, C, may depend linearly on the maximal depth of discharge for a maximal depth of discharge, $D_i^{max}$, greater than a depth of discharge at which the lithium-alloying material contributes substantially to a capacity of the cell, $C_{Si}$, while the cycle-dependent fade parameter, C, may be constant for a maximal depth of discharge, $D_i^{max}$, less than or equal to the depth of discharge at which the lithium-alloying material contributes substantially to the capacity of the cell.

Controller 16 may be configured to determine a remaining capacity of cell 4 based on the time-dependent fade component, $Q_B$, the cycle-dependent fade component, $Q_C$, and a reference capacity of the cell, $Q_0$, as seen in Equation 4. In some examples, the reference capacity of the cell, $Q_0$, may be determined at the beginning of operation of cell 4. For example, controller 16 may receive the reference capacity of cell 4 from reference system 26. In other examples, controller 16 may determine the reference capacity from a full discharge of cell 4, in which case controller 16 may reset a cycle count, including cycle-dependent fade for previous cycles. Controller 16 may be configured to determine a remaining life of cell 4 based on the remaining capacity of cell 4 and a change in the time-dependent fade component, $Q_B$, and the cycle-dependent fade component, $Q_C$, over multiple cycles. For example, controller 16 may track remaining capacity of cell 4 with operating time, t, and cycle, i, and estimate a remaining life based on the tracked capacity. Remaining cell capacity can also be used to predict impedance. Equation 4 can also be modified to take into account overvoltage due to cell impedance. In some examples, the overvoltage ($\Delta V=IR$, where I is current and R cell impedance) can be subtracted from the measured voltage to determine depth of discharge. The impedance can be inferred from the remaining capacity using reference cells or using other techniques known in the art such electrochemical impedance spectroscopy, or voltage relaxation with time in open circuit conditions. In some examples, controller 16 may use remedial actions to extend the life of the cell based on the remaining life of cell 4, such as by limiting discharge to cycle depths above a capacity contribution of the lithium-alloying material.

While the system 2 has been described with respect to capacity, system 2 may also be configured to determine a remaining electrolyte mass of cell 4, as explained above with reference to Equation 3. For example, the time-dependent fade component may be a time-dependent electrolyte consumption component, the cycle-dependent fade component may be a cycle-dependent electrolyte consumption component, and the reference capacity of cell 4 may be a reference amount of electrolyte mass of cell 4. Electrolyte components whose consumption may be calculated include but are not limited to electrolyte components known to improve the cycling of Si-based materials. Electrolyte components may be solid, liquid or gas. Examples include fluorinated organic solvents, fluoroethylene carbonate, difluoroethylene carbonate, vinylene carbonate, propylene carbonate, and carbon dioxide.

For example, reference system 26 may be further or alternatively configured to include cell reference data related to amount and consumption of electrolyte of cell 4. The cell reference data may include any data that relates operating conditions of reference cells 28, such as voltage, temperature, and depth of discharge, to the time-dependent electrolyte consumption component, $m_Z$, and cycle-dependent electrolyte consumption component, $m_X$, of reference cells 28, such as time-dependent consumption parameters, Z, and cycle-dependent consumption parameters, X, as illustrated in Equations 3 and 5 above. For example, reference system 26 may generate cell reference data for relationships between the time-dependent consumption parameter, Z(V, T), with voltage and temperature, the cycle-dependent consumption parameter, $X(D_i^{max},T)$, with maximal depth of discharge and temperature, and depth of discharge, D(V), with voltage, V. Controller 16 may be configured to receive cell reference data relating to consumption of electrolyte, including time-dependent consumption parameter information, Z(V,T), depth of discharge information, D(V), and cycle-dependent fade parameter information, $X(D_i^{max}, T)$, from reference system 26. Cell data may also include data relating to previously measured or determined operating characteristics, such as an amount of electrolyte component of a reference cycle, $m_0$, cycle-dependent consumption parameters for previous cycles, $X_{i-1}$, and full discharges, $X^{full}$, and other cell parameters included in Equations 1-4 above.

Controller 16 may be further or alternatively configured to use cell reference data related to amount and consumption of electrolyte of cell 4. Time logic 18 may determine a time-dependent consumption parameter, Z, from the measured voltage, V, and temperature, T. Time logic 18 may determine the time-dependent electrolyte consumption component, $m_Z$, of cell 4 from the time-dependent consumption parameter, Z, and the operating time, t, according to Equations 3 and 5 above. Cycle logic 20 may determine the cycle-dependent electrolyte consumption component, $m_X$, of cell 4 from the cycle-dependent consumption parameter, X, and the cycle count data. Cycle count data may represent cycle-dependent electrolyte consumption from previous cycles of cell 4, such as cycle-dependent consumption parameters, $X_{i-1}$, for previous cycles. Controller 16 may be configured to determine a remaining electrolyte component of cell 4 based on the time-dependent electrolyte consumption component, $m_Z$, the cycle-dependent electrolyte consumption component, $m_X$, and a reference amount of electrolyte component of the cell 4, $m_0$, as seen in Equations 3 and 5. In some examples, the reference amount of electrolyte of the cell, $m_0$, may be determined at the beginning of operation of cell 4. For example, controller 16 may receive the reference amount of electrolyte of cell 4 from reference system 26. Controller 16 may be configured to determine a remaining life of cell 4 based on the remaining amount of electrolyte of cell 4 and a change in the time-dependent electrolyte consumption component, $m_Z$, and the cycle-dependent electrolyte consumption component, $m_X$, over multiple cycles.

In instances where periodic maintenance of the system is required, the above procedure may provide for notification to the user when maintenance is required. Controller 16 may be further configured to provide a user notification that notifies the user of a maintenance requirement based on depletion of critical materials, such as electrolyte or other additive. For example, controller 16 generate a notification signal based on the remaining amount of electrolyte of cell 4 that includes information regarding a maintenance action, such as addition of electrolyte. Notification of maintenance actions may allow for improved cell operation and extended life.

Figure 2:
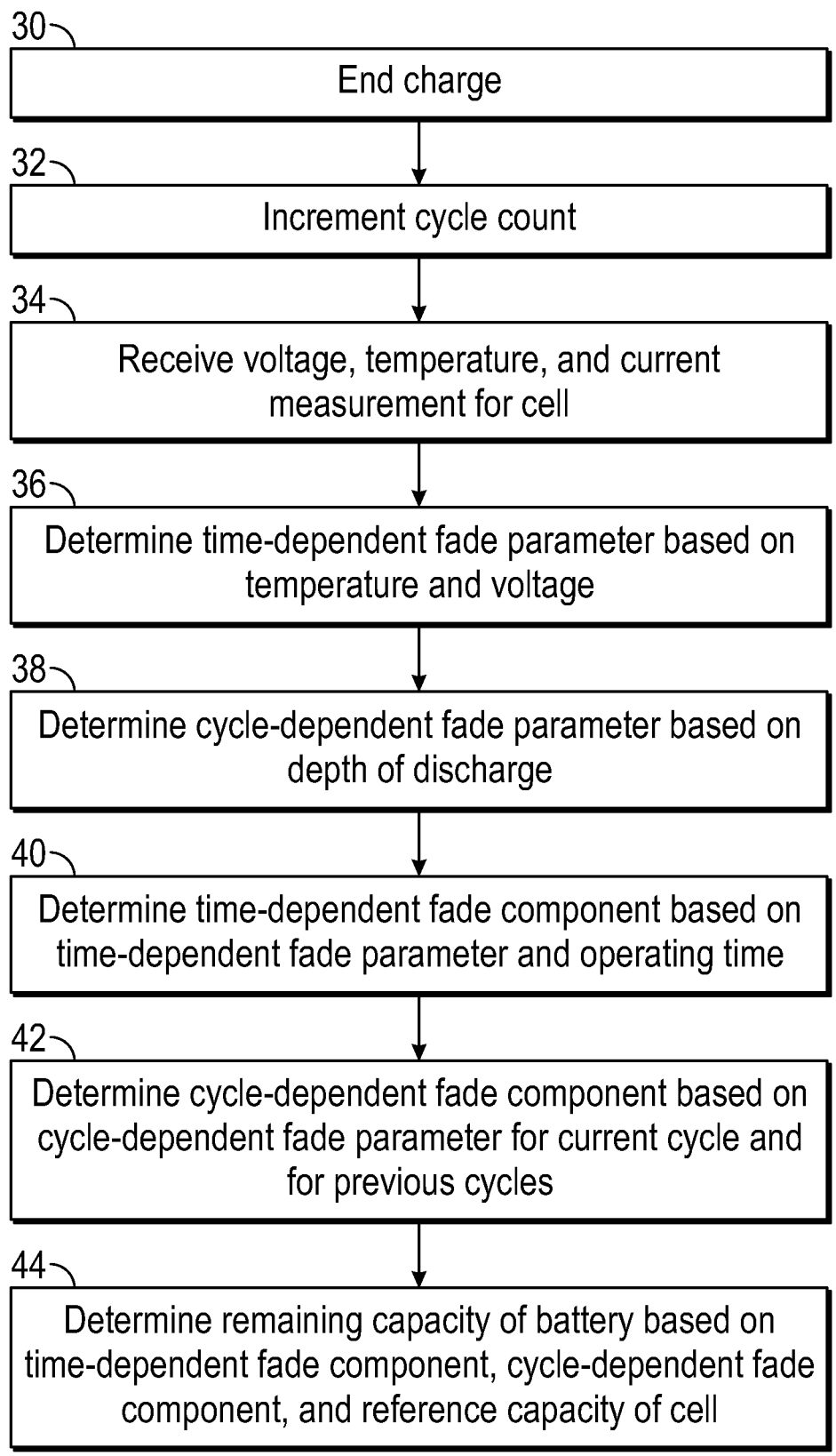
FIG. 2 is a flow diagram of an example method for determining a state of health of a cell in accordance with some embodiments discussed herein.

FIG. 2 is a flow diagram of an example method for determining a state of health of a cell in accordance with some embodiments discussed herein. While the steps are illustrated in a particular linear order, steps of FIG. 2 may be performed in parallel or in a different order. Reference will be made to system 2 of FIG. 1; however, other systems may be used with the techniques of FIG. 2. A cell, such as cell 4, may end a charge operation in a partially discharged state (30). A controller, such as controller 16, may increment a cycle count (32). For example, storage 24 may include a counter that tracks the cycle count of cell 4. After initiation of a charge operation, controller 16 may send a signal to storage 24 to increment the counter to the current cycle count.

Controller 16 may receive a voltage signal, $X_V$, from voltage sensor 10, a temperature signal, $X_T$, from temperature sensor 12, and current signal, $X_I$, from current sensor 14 (34). The voltage signal, $X_V$, may represent a voltage, the temperature signal, $X_T$, may represent a temperature, T, and the current signal, $X_I$, may represent the current, I, of the partially discharged cell.

Controller 16 may determine a time-dependent fade parameter, B, based on the voltage, V, and temperature, T (36). Controller 16 may use the voltage, V, and temperature, T, to determine the time-dependent parameter, B, for cell 4 based on cell reference data. Controller 16 may determine a cycle-dependent fade parameter, C, based on the maximal depth of discharge, $D_i^{max}$ and optionally temperature, T (38). Controller 16 may use the voltage, V, and/or current, I, to determine the maximal depth of discharge. $D_i^{max}$, of cell 4 for the particular cycle, i. Controller 16 may use the maximal depth of discharge, $D_i^{max}$, of cell 4 to determine the cycle-dependent fade parameter, C, for cell 4 based on cell reference data that includes the cycle-dependent fade parameter, C, at a full discharge, $C^{full}$, and a capacity contribution of a lithium-alloying material in the electrode, $C^{Si}$.

Controller 16 may determine a time-dependent fade component. $Q_B$, based on the time-dependent parameter, B, and operating time, t (40). Controller 16 may use the time-dependent parameter, B, and the operating time, t, to determine the time-dependent fade component, $Q_B$, of cell 4 according to Equations 1, 3, or 4 above. Controller 16 may determine a cycle-based fade component, $Q_C$, based on the cycle-dependent parameter, C, and cycle number, i (42). Controller 16 may use the time-dependent fade parameter, C, and cycle count data that includes previous cycle-dependent parameters, $C_i$, to determine the cycle-dependent fade component of cell 4 according to Equations 1, 3, or 4 above.

Controller 16 may determine a remaining capacity of cell 4 (44). Controller 16 may subtract the time-dependent fade component, $Q_B$, and the cycle-dependent fade component, $Q_C$, from the initial capacity, $Q_0$, to determine the remaining capacity, Q, of cell 4. Controller 16 may determine the remaining life of cell 4 based on changes to the remaining capacity, Q, over a period of time.

In one embodiment such a chip or device could receive as inputs the time, current, voltage, and temperature of a cell or pack during its operation and provide a remaining total capacity and or a remaining amount of electrolyte component in the cell or pack. Since measuring currents in a cell or pack may not be trivial, the technique is readily adapted to using only the voltage, time and temperature through the use of a reference voltage-capacity curve. In another embodiment where the cell or pack is connected to a system with existing computational capabilities which already measures the inputs, such as a battery management system, a mobile device, an onboard navigation system, or a personal computer, the algorithm may be programmed to provide a remaining total capacity or a remaining amount of electrolyte component in the cell. Such embodiments are particularly useful in systems where the cell or battery pack is typically not fully discharged such as, but not limited to, automotive and grid applications.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

EXAMPLES

Cell Composition

In the following examples, a 3M Si-alloy was used in anodes of battery cells. The 3M Si-alloy used in these cells has a reversible specific capacity of 1180 mAh/g, a density of 3.5 g/cm$^3$, a specific surface area of 6.9 m$^2$/g and a mean particle size of 5.2 μm.

Cell Composition for Examples 1-10

Dry (no electrolyte) 200 mAh (reversible capacity) lithium cobalt oxide (LCO)/Si:gr pouch cells were obtained from Li-Fun Technology (Xinma Industry Zone. Golden Dragon Road, Tianyuan District, Zhuzhou City, Hunan Province, PRC, 412000). The negative to positive active mass ratio of the pouch cells was adjusted so that the cells may be operated up to 4.35 V without lithium plating. The negative electrode was composed of 15 wt % Si-alloy (3M, described above), 72.3 wt. % of MAGE (Hitachi Chemical) graphite (gr), 10% of Timrex KS6 graphite (IMERYS) as well as 2.7 wt. % of carboxymethl cellulose-styrene butadiene binder with a reversible areal capacity of 3.0 mAh·cm$^{-2}$. The average specific surface area of the anode was 5.1-5.7 m$^2$·g$^{-1}$ and the Si-alloy material represented about 40% of the total capacity of the negative electrode. The positive electrode consisted of 95 wt. % LiCoO$_2$ particles mixed with 2.5 wt. % Super P carbon black (IMERYS) and 2.5 wt. % of polyvinylidene fluoride binder.

Cell Composition for Examples 12-14

Dry (no electrolyte) 240 mAh (reversible capacity) LCO/Si:gr pouch cells were obtained from Li-Fun Technology (Xinma Industry Zone, Golden Dragon Road, Tianyuan District, Zhuzhou City, Hunan Province, PRC, 412000). The negative to positive active mass ratio of the pouch cells was adjusted so that the cells could be operated up to 4.35 V without lithium plating. The negative electrode was composed of 15 wt. % Si-alloy (3M, described above), 70.7 wt. % of BTR-918 (BTR New Materials) graphite, 4% of Timrex KS6 graphite (IMERYS), 0.3 wt. % Super P carbon black (IMERYS) as well as 10 wt. % of lithium polyacrylate binder with a reversible areal capacity of 3.0 mAh·cm$^{-2}$. The positive electrode consisted of 95 wt. % LiCoO$_2$ particles mixed with 2.5 wt. % Super P carbon black (IMERYS) and 2.5 wt. % of polyvinylidene fluoride binder.

All pouch cells were filled with a 1M LiPF$_6$ EC:EMC:FEC (27:63:10) (by weight) unless stated otherwise. The molarity of the salt may be calculated based on the total initial volume of the mixed solution of EC, EMC, and FEC (volume of the final blend). Cells were then sealed under vacuum at a pressure of −90 kPa (relative to atmospheric pressure).

Cell Formation

Formation Protocol A: Once sealed, the pouch cells were connected to a Maccor 4000 series charger and held at 2.0 V for 24 hours in a 22° C. temperature-controlled room or a 40° C. temperature-controlled box to promote wetting. Cells were then charged to 3.8 V at a current corresponding to C/20 and held at that potential for 1 hour. The pouch cells were then moved to an argon-filled glove-box to be opened and re-sealed under vacuum in order to remove any gas formed during the first charge to 3.8 V. The pouch cells were then connected back to the charger and charged to 4.35 V at C/20 and 40° C. and then discharged to 3.0 V at C/20.

Formation Protocol B: Once sealed, the pouch cells were connected to a Neware BTS4000 charger in a 22° C. temperature controlled room and charged to 2.0V at 10 mA and held at that potential until the current dropped to 1 mA, after which the cell was rested at open circuit for 12 hours. The cell was charged once more to 2.0V at 10 mA and held at that potential until the current dropped to 1 mA, after which the cell was rested at open circuit for 12 hours. The cell was then charged to 3.8V at 10 mA. The pouch cells were then moved to a dry-room with a dew point of less than −40° C. to be opened and re-sealed under vacuum in order to remove any gas formed during the first charge to 3.8 V. The pouch cells were then connected back to the charger and charged to 4.35 V at 10 mA and held at that potential until the current dropped to 5 mA. The cells were then discharged to 2.75 V at 10 mA.

Cell Cycling

Full Cycling Protocol: Cells were charged to 4.35 V at a constant current (CC) of 100 mA (or as indicated) and held at that potential until the current dropped to 10 mA. Cells were then discharged at the constant current to a lower cut-off voltage (LCV) of 3.0 V or 2.75 V. This was repeated until cells were removed from the charger.

Partial Depth of Discharge (DOD) Protocol: Cells underwent one full cycle by being charged to 4.35 V at 100 mA and held at that potential until the current dropped to 10 mA. The cells were then discharged at 100 mA to a lower cut-off voltage (LCV) of 3.0 V or 2.75 V. The cells then underwent 9 partial discharge cycles by being charged to 4.35 V at 100 mA and held at that potential until the current dropped to 10 mA. The cells were then discharged at 100 mA until a discharge capacity was achieved or the LCV was reached. The pattern of one full cycle and nine partial DOD cycles was repeated until the cells were removed from the charger.

Mid Partial DOD Protocol: In another variation of partial DOD cycling, cells underwent one full cycle by being charged to 4.35 V at 100 mA and held at that potential until the current dropped to 10 mA; then discharged at 100 mA to a lower cut-off voltage (LCV) of 2.75 V. Cells then underwent 9 partial discharge cycles by being charged to an upper cut-off voltage (UCV) at 100 mA and held at that potential until the current dropped to 10 mA. The cells were then discharged at 100 mA until a discharge capacity was achieved or the LCV was reached. The pattern of one full cycle and nine partial DOD cycles was repeated until cells were removed from the charger.

Chemicals

All electrolyte chemicals were obtained from BASF and used as received. Table 1 below is a table of purity and water content of the chemicals used in the formulation of the electrolytes.

| Chemical | Purity/% | Water content/ppm |
|---|---|---|
| LiPF$_6$ | 99.94 | 14 ppm |
| EC:EMC (3:7 wt:wt) | | <20 ppm |
| FEC | 99.94 | <20 ppm |

GC/MS Analysis of Electrolyte

The analysis of the composition of the electrolyte from cycled LCO/Si:gr pouch cells followed the procedure described by Petibon et al. in (R. Petibon, L. Rotermund, K. J. Nelson, A. S. Gozdz, J. Xia, J. R. Dahn, J. Electrochem. Soc. 161 (2014) A1167-A1172). This technique uses CH2Cl2 to extract the electrolyte from cycled pouch cells (in the discharged state). A simple liquid-liquid extraction using a mixture of CH$_2$Cl$_2$ and water (CH$_2$Cl$_2$:H$_2$O, 150:1, wt.:wt.) was then used in order to separate the organic components (EC, EMC, additive . . . ) from the inorganic components (LiPF$_6$, HF, PF$_5$). The organic phase was then separated and analyzed using gas chromatography (GC) coupled with mass spectrometry (MS).

The GC-MS used was a Bruker 436-GC equipped with a split/split-less injector and a BR-5MS 30 m column with an inner diameter of 0.25 mm and a coating thickness of 1 μm. Helium was used as a carrier gas at a constant flow rate of 1.3 mL·min$^{-1}$. The GC was coupled to a Bruker Scion single quadrupole mass spectrometer equipped with an electron impact ionization module. The injector temperature was set to 250° C., the transfer line was set to 270° C., and the ion source was set to 270° C. The electron energy was set to 70 eV. The mass spectrometer was set to a single ion monitoring mode (SIM) for the measurement of EC, EMC, DMC. DEC, FEC and known by-products of the dimerization of EC with either EMC, DMC or DEC.

Calibration solutions were made and analyzed during quantitative analysis of electrolyte components. The calibration solutions were made by diluting known amounts of electrolyte solvents and additives in CH$_2$Cl$_2$. A minimum of six solutions of known concentration were used to obtain an external calibration curve with a squared correlation coefficient of at least 0.999.

Table 3 illustrates cycling conditions of Examples 1-10 described below.

| Example | Formation Protocol | Cycling Protocol | CC (mA) | LCV (V) | Limited Discharge Cap (mAh) | Temperature (° C.) |
|---|---|---|---|---|---|---|
| 1 | A | Full | 100 | 3.0 | N/A | 40 |
| 2 | A | Full | 25 | 3.0 | N/A | 40 |
| 3 | A | Full | 12.5 | 3.0 | N/A | 40 |
| 4 | A | Full | 6.25 | 3.0 | N/A | 40 |
| 5 | A | Partial | 100 | 3.0 | 140 | 40 |
| 6 | A | Partial | 100 | 3.0 | 100 | 40 |
| 7 | B | Full | 100 | 2.75 | N/A | 22 |
| 8 | B | Partial | 100 | 2.75 | 160 | 22 |
| 9 | B | Partial | 100 | 2.75 | 120 | 22 |
| 10 | B | Partial | 100 | 2.75 | 100 | 22 |

Table 4 below illustrates fitting results of Examples 1-10 described below

| Example | B (h$^{-1/2}$) | C (cycle$^{-1}$) | Q$_0$ | t$_0$ (h) |
|---|---|---|---|---|
| 1 | 4.8 × 10$^{-3}$ | 3.9 × 10$^{-4}$ | 1.00 | 0 |
| 2 | | | 1.00 | 5.4 |
| 3 | | | 1.01 | 14 |
| 4 | | | 1.04 | 60 |
| 5 | 5.2 × 10$^{-3}$ | 8.5 × 10$^{-5}$ | 1.00 | 0 |
| 6 | 6.5 × 10$^{-3}$ | 0.0 | 1.00 | 0 |
| 7 | 3.9 × 10$^{-3}$ | 4.3 × 10$^{-4}$ | 1.00 | 2 |
| 8 | 3.3 × 10$^{-3}$ | 2.0 × 10$^{-4}$ | 1.00 | 2 |
| 9 | 4.1 × 10$^{-3}$ | 0.0 | 1.00 | 2 |
| 10 | 4.7 × 10$^{-3}$ | 0.0 | 1.00 | 2 |

Examples 1-4

In order to evaluate the time dependence and cycle number dependence of the capacity fade and FEC consumption. LCO/Si:gr pouch cells were cycled at different rates.

Figure 3B:
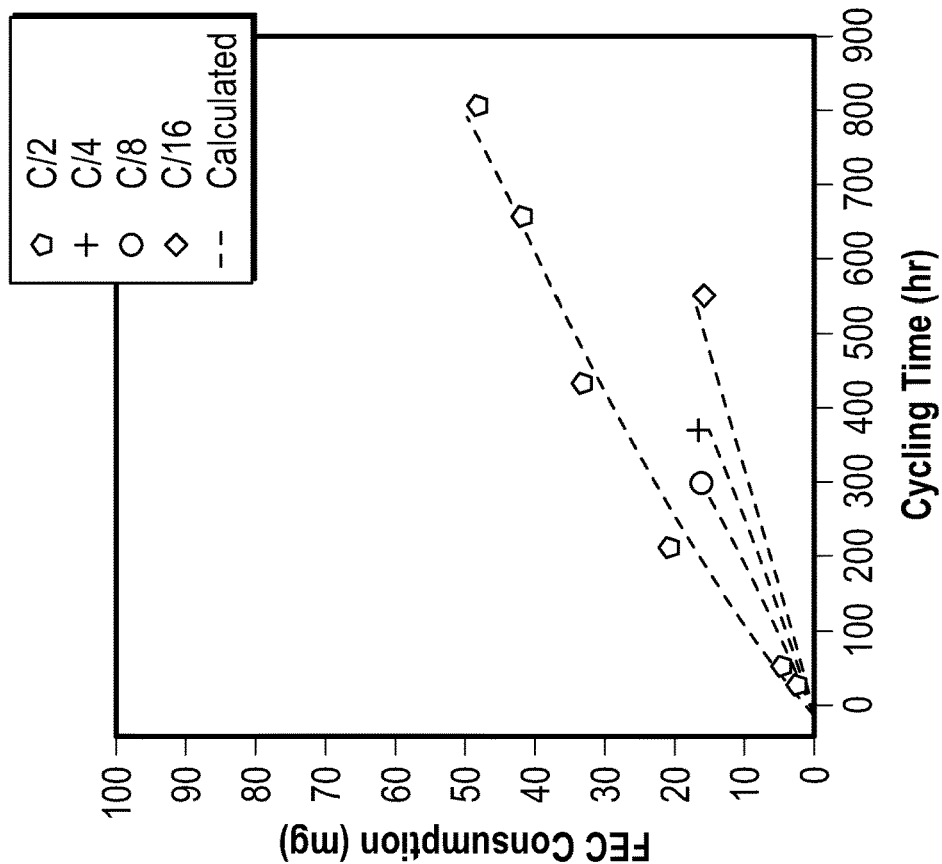
FIG. 3B is a graph of FEC consumption as a function of cycling time at various C-rates.
Figure 3A:
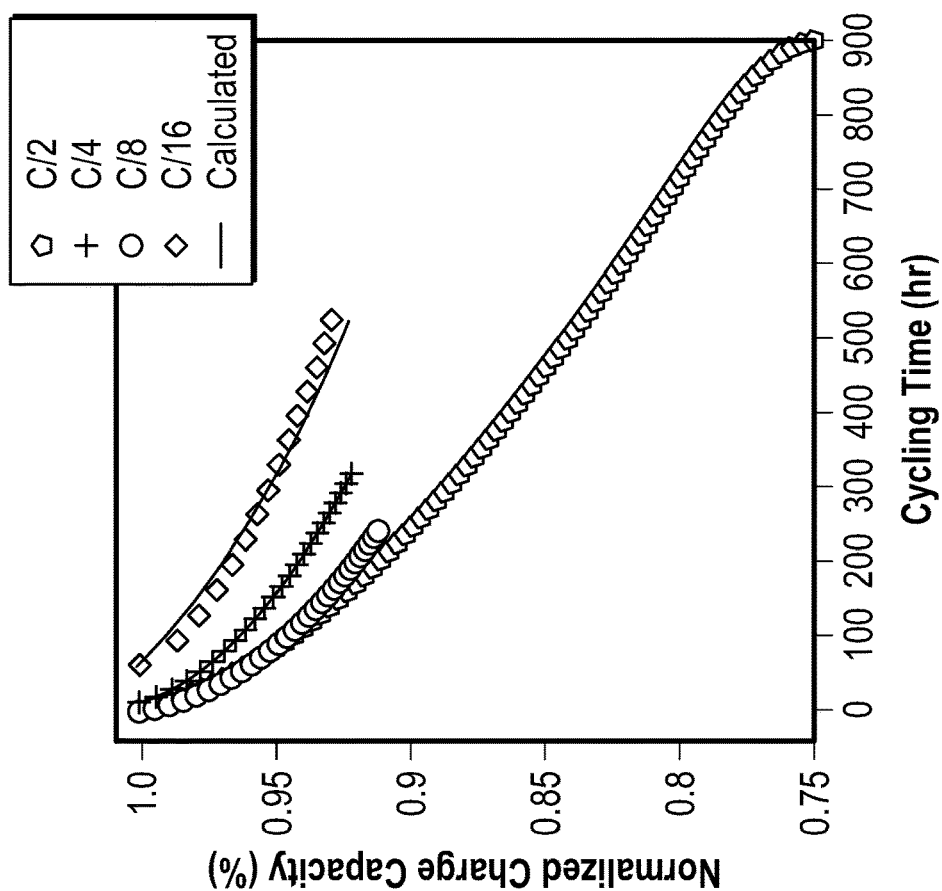
FIG. 3A is a graph of normalized charge capacity as a function of cycling time at various C-rates.

FIG. 3A is graph of normalized charge capacity as a function of cycling time for cells from Examples 1, 2, 3, 4 which were cycled at C/2, C/4, C/8 and C/16 respectively (the charge capacities were normalized to the second cycle). FIG. 3A shows that for an equal cycling time, cells cycled the fastest (i.e. with a higher cycle count) experienced a higher capacity loss. This indicates that the fade of LCO/Si:gr cells has both a time dependence and a cycle number dependence. A model was developed in order to decouple these two dependences. The capacity of the LCO/Si:gr cells cycled at various rates were fit using:

$$Q = Q_0 - B(t + t_0)^{\frac{1}{2}} - C_n \quad \text{[Equation 5]}$$

In the Equation 5 above, Q corresponds to the normalized capacity, Q$_0$ corresponds to the capacity of the reference cycle (cycle 2, set to ~1 and allowed to vary slightly), B is a constant related to the time dependence of the capacity fade, t is the cycling time, t$_0$ is a constant to account for the time of the degassing step, and C is a constant related to the cycle number dependence of the capacity fade. The time dependence was set to be proportional to the square root of time. The cycle number dependence may come from the SEI repair at the surface of the Si-alloy particles due to the volume changes upon lithiation and delithiation. As seen in FIG. 3A, the simple model described above fits the data very well with single values for the B and C parameters allowing simultaneous agreement with experiments across a wide range of cycling rates. The parameters extracted from the fit of the data in FIG. 1a using Equation 1 are B=4.8×10$^{-3}$ and C=0.39×10$^{-3}$.

FIG. 3B is a graph of the FEC consumption as a function of cycling time for LCO/Si:gr cells cycled at various C-rates. In order to evaluate the time dependence and cycle number dependence of the consumption of FEC, the electrolyte of LCO/Si:gr in the cells of Examples 1, 2, 3, 4, which were cycled at C/2, C/4, C/8 and C/16 and 40° C., were analyzed using GC-MS. Each data point shown in FIG. 3B is an average of two cells. In total, the electrolyte of 24 cells were analyzed at various cycle numbers and cycling rates. Similarly to the fade, FIG. 3B shows that the consumption of FEC has both a time dependence and a cycle number dependence. Since FEC is involved in the passivation of both the surface of the graphite and the Si-alloy particles, the consumption of FEC was modeled using an expression similar to the capacity fade and using:

$$m_{FEC} = Z(t + t_0)^{\frac{1}{2}} + X_n \quad \text{[Equation 6]}$$

In Equation 6 above, $m_{FEC}$ is the mass of FEC consumed, Z is a constant related to the time dependence of the consumption of FEC, and X is a constant related to the cycle number dependence of the consumption of FEC. As seen in FIG. 3B, the model fits the experimental data well across a wide range of cycling rates. The parameters extracted from the fit of the data of FIG. 3B using Equation 2 are Z=0.61 mg·h$^{-1/2}$ and X=0.16 mg·cycle$^{-1}$.

Figure 3D:
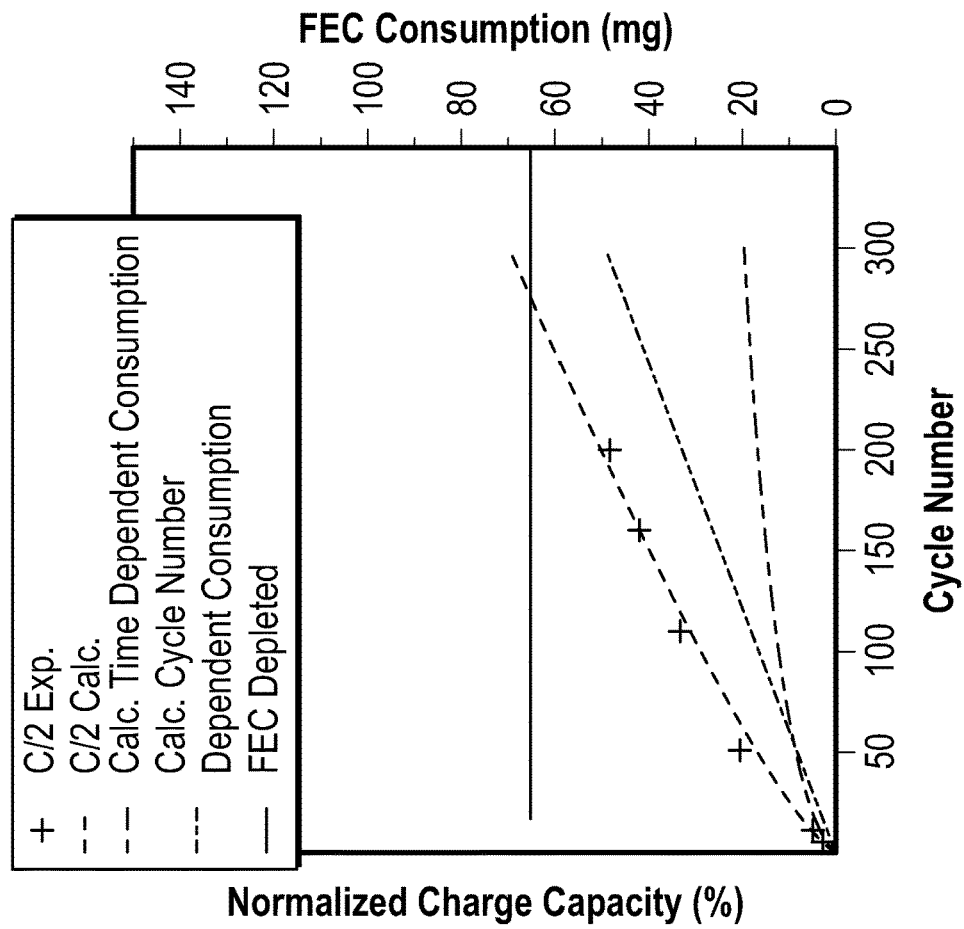
FIG. 3D is a graph of FEC consumption, time-dependent consumption, and cycle-dependent consumption as a function of cycle number.
Figure 3C:
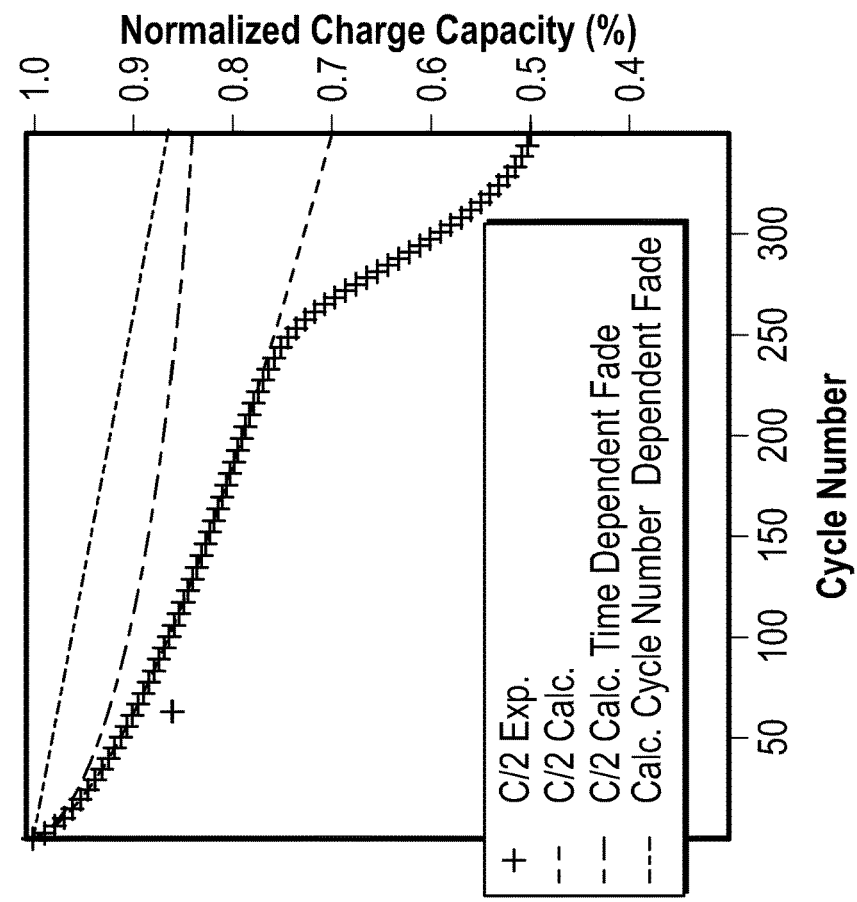
FIG. 3C is a graph of normalized discharge capacity, time-dependent fade, and cycle-dependent fade as a function of cycle number.

FIGS. 3C and 3D show the normalized discharge capacity and FEC consumption, respectively, as a function of cycle number alongside the time dependent and cycle number dependent portions of the capacity fade and FEC consumption obtained from the fitting of the data in FIGS. 3A and 3B, respectively. FIGS. 3C and 3D show that while the time dependence may be the major contributor to the fade during the first 250 cycles, the cycle number dependence may be the major contributor to the consumption of FEC. FIG. 3D may also fairly accurately predict the cycle number to failure. For instance, the fitted parameters predict the depletion of FEC at the 270th cycle for Example 1 cells, while the cells experience failure at the 250th cycle.

The results presented in FIGS. 3C and 3D illustrate that a combination of two simple models are able to predict both the capacity fade and the sudden failure of Si-alloy containing full cells. These figures indicate that the time dependence as well as the cycle number dependence of the fade may be reduced to achieve improved performance of the cells. Lowering the time dependence of the fade may help reduce the capacity loss before the depletion of FEC while reducing the cycle number dependence of the fade will delay the depletion of FEC and the associated sudden failure.

Examples 5-6

Figure 4:
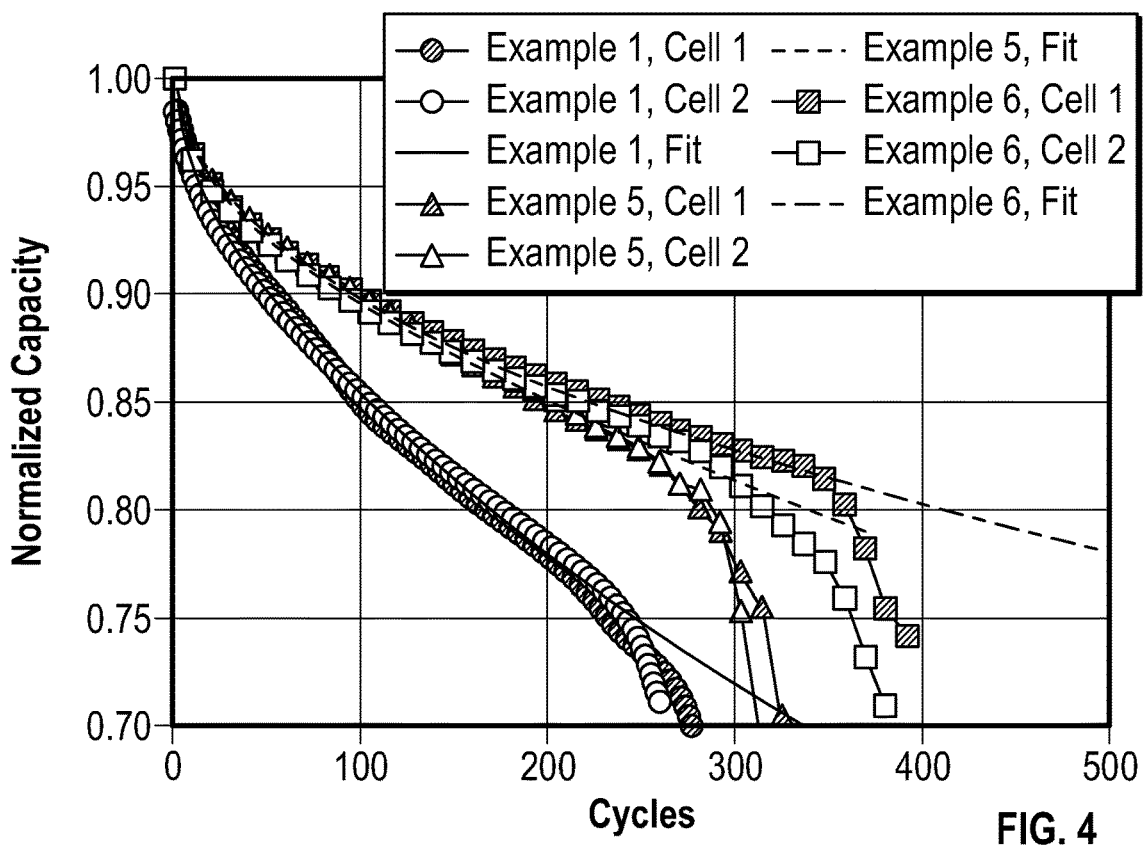
FIG. 4 is a graph of normalized capacity for full range cycles of Examples 5-6, cycles of Example 1.

Examples 5 and 6 cells were cycled at 40° C. with partial cycling protocols with 140 mAh and 100 mAh partial discharges respectively, as detailed in Table 3. FIG. 4 is a graph of normalized capacity for full range cycles (every tenth cycle) of Examples 5 and 6, as well as the data of Example 1. The absolute slope of the capacity retention gradually decreases until it reaches an inflexion point then increases and finally sudden failure occurs. Equation 1 was fit to the data preceding the inflexion point Table 4 lists the fitting parameters obtained for Examples 5 and 6.

Examples 7-10

Figure 5:
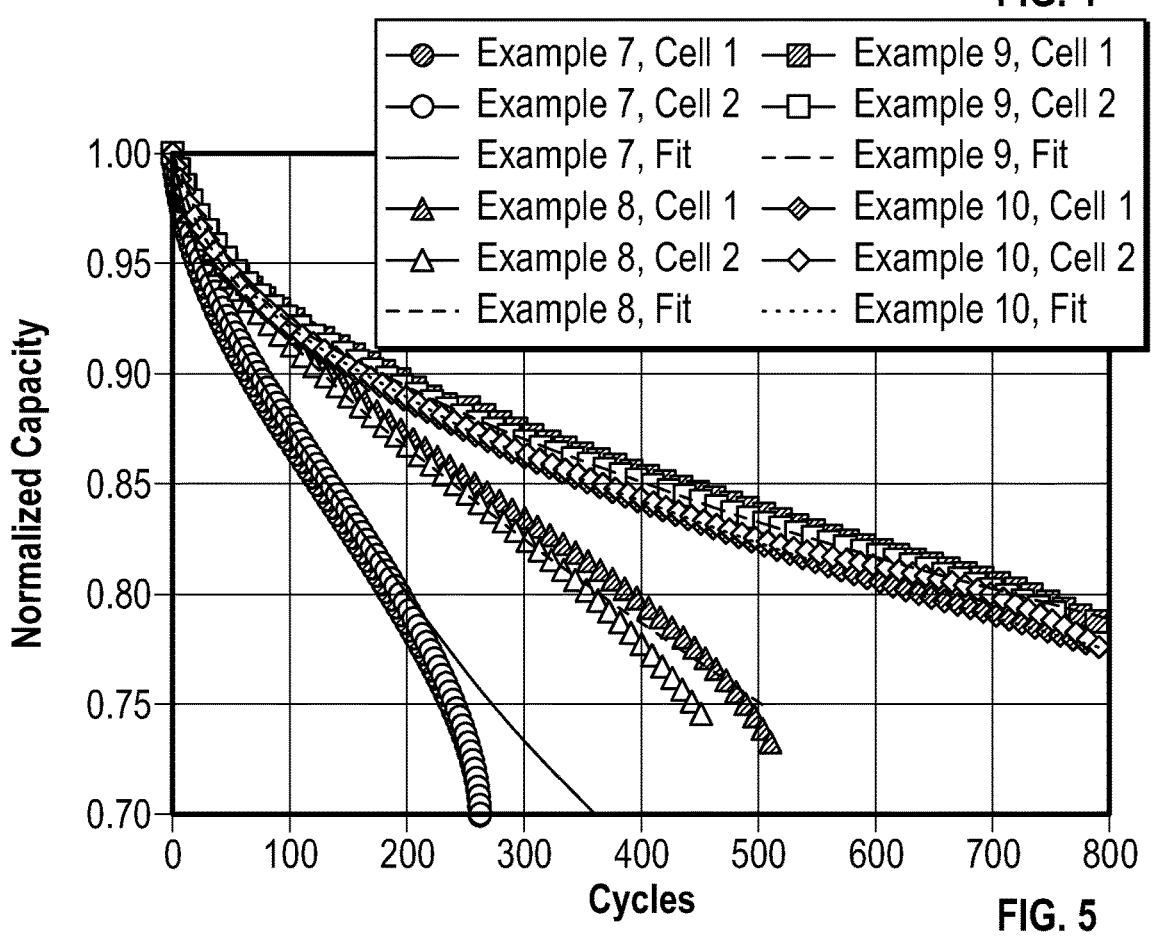
FIG. 5 is a graph of normalized capacity for full range cycles of Examples 8-10 and cycles of Example 7.

Cells were cycled at 22° C. with full range cycling (Example 7) and partial cycling protocols with Examples 8, 9, and 10 having 160 mAh, 120 mAh. and 100 mAh partial discharges respectively, as detailed in Table 3, two sister cells were cycled for each example. FIG. 5 is a graph of normalized capacity for full range cycles (every tenth cycle) of Examples 8, 9, and 10 as well as all the cycles of Example 7. The absolute slope of the capacity retention gradually decreases until it reaches an inflexion point then increases and finally sudden failure occurs. Equation 4 was fit to the data preceding the inflexion point. Table 4 lists the fitting parameters obtained for Examples 7-10.

State of Health Method

FIGS. 6A and 6B are graphs of the time-dependent fade parameters, B, and cycle-dependent fade parameters, C, respectively, for averaged voltage (V) and averaged depth of discharge (%), respectively, for all the fits of Examples 1, 5-10. FIG. 6A illustrates that the time-dependent fade parameter, B, increases with increasing average voltage and increasing temperature. This is consistent with the understanding that the time-dependent fade parameter, B, captures the fade caused by parasitic reactions, as parasitic reactions are expected to increase with temperature and average voltage.

FIG. 6B shows the cycle number dependent parameter, C, as a function of averaged depth of discharge. The C parameter is high when cycling a cell with full depth of discharge and linearly decreases with decreasing depth of discharge until approximately 60% where it becomes zero. The dependence of the C parameter on depth of discharge can be understood by considering the contribution of graphite and silicon-material to the capacity as a function of depth of discharge.

FIG. 6C is a graph of the capacity contribution of the Si alloy and the graphite as a function of depth of discharge at a C/2 rate for the cells used in Examples 1-10, which contain 15 wt. % Si-alloy. There is a very distinct separation between the graphite and Silicon capacity contributions due to the difference in average delithiation voltages of the graphite (~0.13 V vs Li metal) and the Silicon (~0.43 V vs Li metal). If a cell is discharged to 60% depth of discharge or less, the Si-material is not utilized. This clearly indicates that the cycle-dependent contribution to the fade is caused by the Si-alloy and depends on how deeply the Si is cycled. If the cell is cycled in such a way that the Si is not utilized, cycle-dependent fade will be minimal in a properly designed cell.

Examples 12-14

Cells were prepared as in previous examples and cycled with a mid-partial DOD protocol as listed in Table 5 below.

| Example | Formation Protocol | Cycling Protocol | CC (mA) | UCV (V) | Limited Discharge Cap (mAh) | Temperature (° C.) |
|---|---|---|---|---|---|---|
| 12 | A | Partial | 100 | 4.25 | 100 | 22 |
| 13 | A | Partial | 100 | 4.07 | 100 | 22 |
| 14 | A | Partial | 100 | 3.90 | 100 | 22 |

Figure 7:
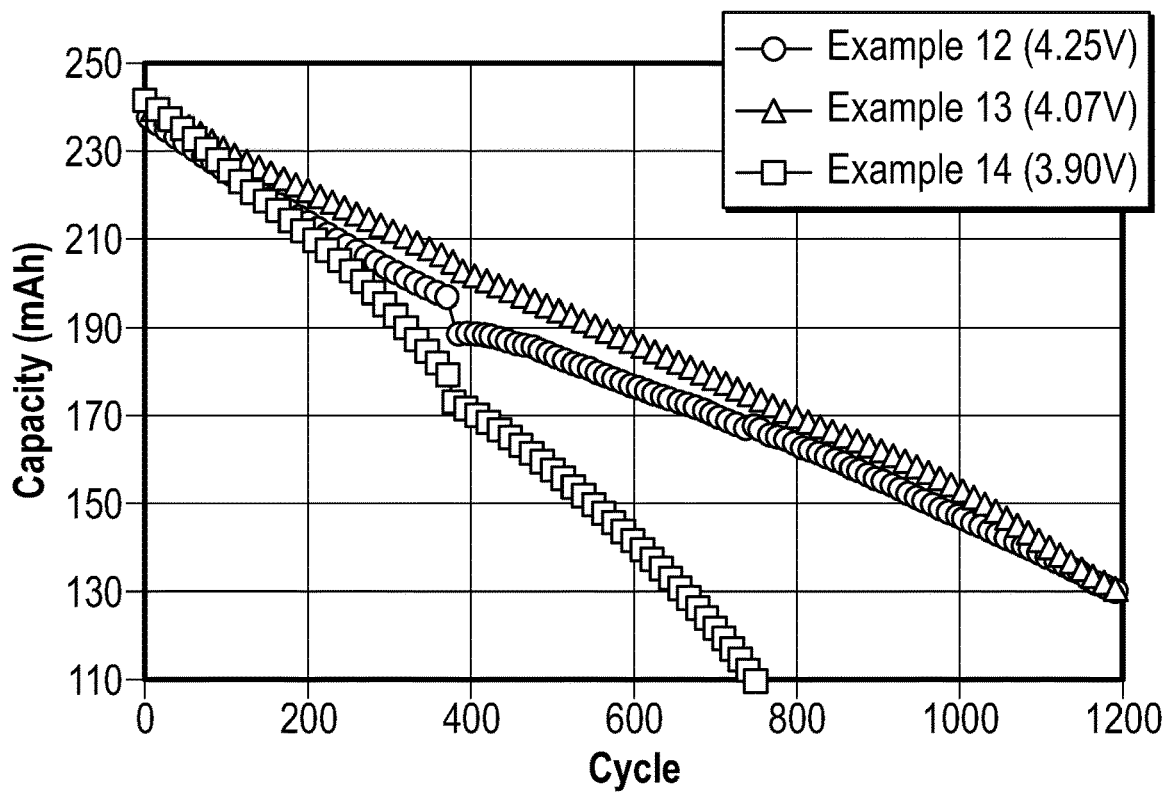
FIG. 7 is a graph of charge capacity for full range cycles of Examples 12-14.

FIG. 7 is a graph of charge capacity for full range cycles (every tenth cycle) for Examples 12-14. As expected the voltage range where most of the cycling occurs has a large impact on the capacity retention of the cells.

Example 15

The predictive ability of the fade model is demonstrated here. Using only the first cycle voltage curve of Example 12 and an approximation of the B and C parameters as determined in Examples 1-10, fade curves are predicted based on the cycling protocols of Examples 12-14. The "B" parameter was approximated by 0 if V<3.4 and by 0.8%·(V−3.4)/(4.2−3.4) if V≥3.4, where V is the lowest voltage achieved in the discharge for a given cycle. This is a linear approximation of the "B" parameter found in FIG. 4. The "C" parameter was approximated by 0 if D<0.65 and by 0.04%·(D−0.65)/(1−0.65) if D≥0.65, where D is the depth of discharge achieved for a given cycle. This is a linear approximation of the "C" parameter found in FIG. 5.

Figure 8:
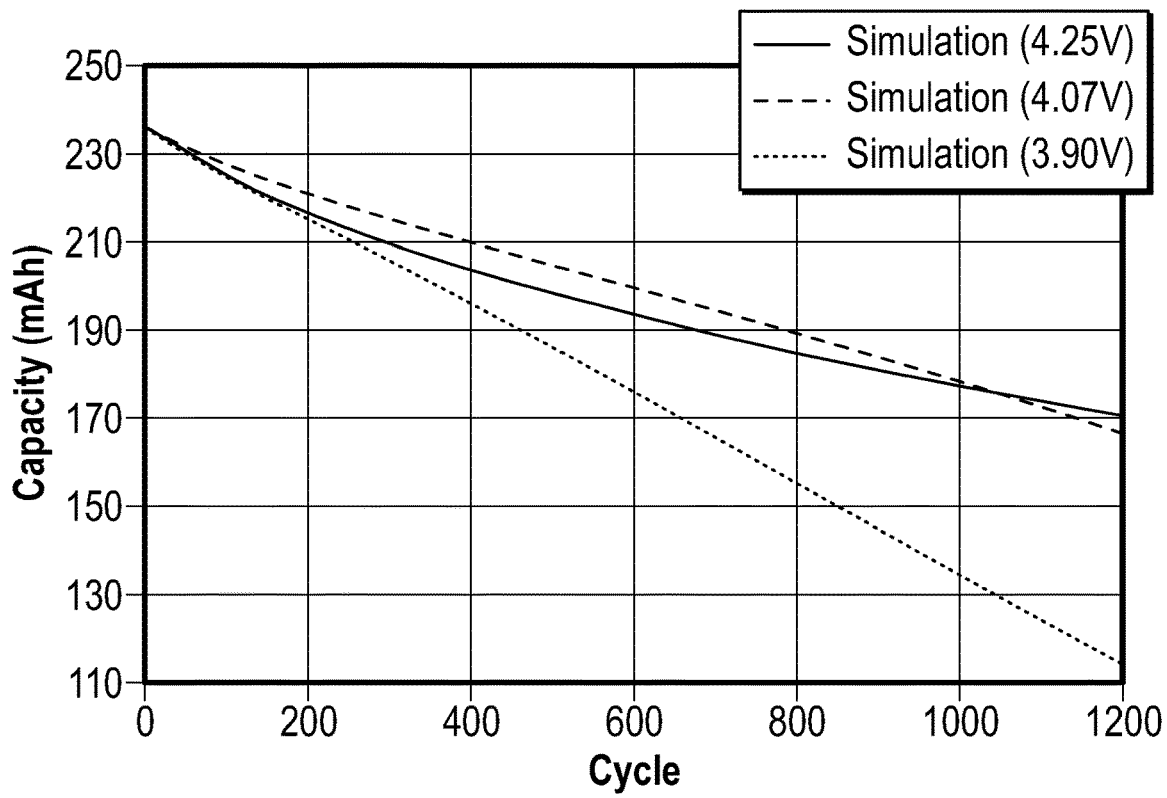
FIG. 8 is a graph of charge capacity versus cycle for the simulation of Example 15.

FIG. 8 is a graph of charge capacity versus cycle for the simulation of Example 15. All the primary features of the experimental result shown in FIG. 7 are present in the simulation of Example 15. The simulation fade curves were obtained without any knowledge of the experimental results obtained in Examples 12-14. In a real-world scenario the capacity would be reset to the experimental value in the event of a full cycle being completed. This would even further increase the accuracy of the prediction model. This result demonstrates that the model is successful at predicting the full capacity available in a full cell with an anode comprising Si that has undergone partial discharge cycling. The model is applicable even if the full cell is not charged to its maximal voltage at every cycle.

Since the model provides a value for the state of health of the cell in the form of the full range capacity of the cell, and that it is able to predict the impact of cycling protocol on the life of the cell, the model can also be used to adopt cycling protocols in order to extend the life of a cell. A non-limiting example would be to limit the depth of discharge of the cell in order to minimize the fade yielded by the "C" parameter.

Various examples have been described. These and other examples are within the scope of the following claims.

The invention claimed is:

1. A method, comprising:
receiving, by a controller, a temperature signal representing a temperature of a partially discharged cell, wherein the cell includes a lithium-alloying material in an electrode;
receiving, by the controller, a voltage signal representing a voltage of the partially discharged cell;
determining, by the controller, a time-dependent fade component of the cell based on the temperature, the voltage, and an operating time of the cell;
determining, by the controller, a cycle-dependent fade component of the cell based on a depth of discharge of the partially discharged cell and cycle count data representing cycle-dependent fade from previous cycles of the cell; and
determining, by the controller, a remaining capacity of the cell based on the time-dependent fade component, the cycle-dependent fade component, and a reference capacity of the cell.

2. The method of claim 1, further comprising determining, by the controller, the depth of discharge based on the voltage.

3. The method of claim 1, further comprising:
receiving, by the controller, a current signal representing a current of the partially discharged cell; and
determining, by the controller, the depth of discharge based on the current.

4. The method of claim 1, wherein determining the time-based fade component further comprises:
determining a time-dependent fade parameter based on the temperature and the voltage, wherein the time-dependent fade parameter is derived from a reference cell corresponding to the cell; and
determining the time-dependent fade component based on the time-dependent fade parameter and the operating time of the cell.

5. The method of claim 1, wherein determining the cycle-based fade further comprises:
determining a cycle-dependent fade parameter based on the depth of discharge, wherein the cycle-dependent fade parameter is derived from a reference cell corresponding to the cell; and
determining the cycle-based fade component based on the cycle-dependent fade parameter and the cycle count data, wherein the cycle count data includes cycle-dependent fade parameters from previous cycles.

6. The method of claim 5, wherein the cycle-dependent fade parameter depends on the depth of discharge for a depth of discharge greater than a depth of discharge at which the lithium-alloying material contributes substantially to a capacity of the cell.

7. The method of claim 6, wherein the cycle-dependent fade parameter depends on the depth of discharge in a monotonically increasing way for a depth of discharge greater than a depth of discharge at which the lithium-alloying material contributes substantially to a capacity of the cell.

8. The method of claim 6, wherein the cycle-dependent fade parameter depends linearly on the depth of discharge for a depth of discharge greater than a depth of discharge at which the lithium-alloying material contributes substantially to a capacity of the cell.

9. The method of claim 5, wherein the cycle-dependent fade parameter is constant for a depth of discharge less than or equal to a depth of discharge at which the lithium-alloying material contributes substantially to the capacity of the cell.

10. The method of claim 9, wherein the cycle-dependent fade parameter is 0 for a depth of discharge less than or equal to the depth of discharge at which the lithium-alloying material contributes substantially to the capacity of the cell.

11. The method of claim 1, wherein determining the cycle-dependent fade is further based on the temperature.

12. The method of claim 1, wherein the lithium-alloying material is a silicon-based material.

13. The method of claim 12, wherein the silicon-based material is a silicon-based alloy and the electrode includes graphite.

14. The method of claim 12, wherein the silicon-based material is a silicon-based alloy comprising silicon, a transition metal, and carbon.

15. The method of claim 1, wherein the cell includes an electrolyte containing at least one of fluoroethylene carbonate, difluoroethylene carbonate, vinylene carbonate, propylene carbonate, and carbon dioxide.

16. The method of claim 1, wherein the time-dependent fade component is a time-dependent electrolyte consumption component, the cycle-dependent fade is a cycle-dependent electrolyte consumption component, the remaining capacity is a remaining amount of electrolyte mass, and the initial capacity of the cell is an initial amount of electrolyte mass.

17. A system, comprising:
a controller configured to:
receive a temperature signal representing a temperature of a partially discharged cell, wherein the cell includes a lithium-alloying material in an electrode;
receive a voltage signal representing a voltage of the partially discharged cell;
determine a time-dependent fade component of the cell based on the temperature, the voltage, and an operating time of the cell;
determine a cycle-dependent fade component of the cell based on a depth of discharge of the partially discharged cell and cycle count data representing cycle-dependent fade from previous cycles of the cell; and
determine a remaining capacity of the cell based on the time-dependent fade component, the cycle-dependent fade component, and a reference capacity of the cell.

18. The system of claim 17, wherein the controller is further configured to:

determine a time-dependent fade parameter based on the temperature and the voltage, wherein the time-dependent fade parameter is derived from a reference cell corresponding to the cell;

determine the time-dependent fade component based on the time-dependent fade parameter and the operating time of the cell determine a cycle-dependent fade parameter based on the depth of discharge, wherein the cycle-dependent fade parameter is derived from a reference cell corresponding to the cell; and determine the cycle-based fade component based on the cycle-dependent fade parameter and the cycle count data, wherein the cycle count data includes cycle-dependent fade parameters from previous cycles.

19. The system of claim 17, further comprising:

a temperature sensor coupled to the controller and configured to measure the temperature and send the temperature signal; and a voltage sensor coupled to the controller and configured to measure the voltage and send the voltage signal.

20. A computer-readable storage medium storing instructions that, when executed, cause a controller to:

receive a temperature signal representing a temperature of a partially discharged cell, wherein the cell includes a lithium-alloying material in an electrode;

receive a voltage signal representing a voltage of the partially discharged cell;

determine a time-dependent fade component of the cell based on the temperature, the voltage, and an operating time of the cell;

determine a cycle-dependent fade component of the cell based on a depth of discharge of the partially discharged cell and cycle count data representing cycle-dependent fade from previous cycles of the cell; and determine a remaining capacity of the cell based on the time-dependent fade component, the cycle-dependent fade component, and a reference capacity of the cell.

* * * * *